(12) United States Patent
Kim et al.

(10) Patent No.: US 7,501,655 B2
(45) Date of Patent: *Mar. 10, 2009

(54) THIN FILM TRANSISTOR ARRAY PANEL

(75) Inventors: Kyung-Wook Kim, Seoul (KR); Beom-Jun Kim, Seoul (KR); Sung-Man Kim, Seoul (KR); Byeong-Jae Ahn, Seoul (KR); Young-Goo Song, Suwon-si (KR); Hyang-Shik Kong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/749,426

(22) Filed: May 16, 2007

(65) Prior Publication Data

US 2007/0211188 A1      Sep. 13, 2007

Related U.S. Application Data

(63) Continuation of application No. 11/008,720, filed on Dec. 8, 2004, now Pat. No. 7,223,997.

(30) Foreign Application Priority Data

Dec. 10, 2003    (KR) .................... 10-2003-0089490

(51) Int. Cl.
    H01L 29/04    (2006.01)
(52) U.S. Cl. ............................. 257/59; 257/48; 257/72; 257/E21.657; 257/E21.703; 257/E27.131
(58) Field of Classification Search .................. 257/59, 257/72
    See application file for complete search history.

(56) References Cited

U.S. PATENT DOCUMENTS 6,191,831 B1    2/2001    Kim et al.
6,320,221 B1    11/2001    Choi et al.

(Continued)

FOREIGN PATENT DOCUMENTS

CN        1333475 A        1/2002

OTHER PUBLICATIONS

Office Action dated Aug. 24, 2007 from Chinese Patent Application corresponding to U.S. Appl. No. 11/749,426 and English Translation.

*Primary Examiner*—Dao H Nguyen
(74) *Attorney, Agent, or Firm*—MacPherson Kwok Chen & Heid LLP

(57) ABSTRACT

A thin film array panel is provided, which includes: a gate line formed on a substrate; a first insulating layer formed on the gate line; a semiconductor layer formed on the gate insulating layer; a data line formed on the gate insulating layer and intersecting the gate line; a drain electrode formed at least on the semiconductor layer; a conductor arranged in parallel to the data line; a second insulating layer formed on the data line, the drain electrode, and the conductor and having a first contact hole exposing a portion of the drain electrode; and a pixel electrode formed on the second insulating layer, connected to the drain electrode through the first contact hole, fully covering the data line.

14 Claims, 31 Drawing Sheets

U.S. PATENT DOCUMENTS

| | | |
|---|---|---|
| 6,429,916 B1 | 8/2002 | Nakata et al. |
| 6,590,226 B2 | 7/2003 | Kong et al. |
| 6,611,311 B1 | 8/2003 | Kretz et al. |
| 6,650,390 B2 | 11/2003 | Sakamoto et al. |
| 6,762,802 B2 | 7/2004 | Ono et al. |
| 6,798,442 B1 | 9/2004 | Kim et al. |
| 6,933,989 B2 | 8/2005 | Oke et al. |
| 7,223,997 B2 * | 5/2007 | Kim et al. ............ 257/59 |
| 2005/0082492 A1 | 4/2005 | Lin et al. |

* cited by examiner

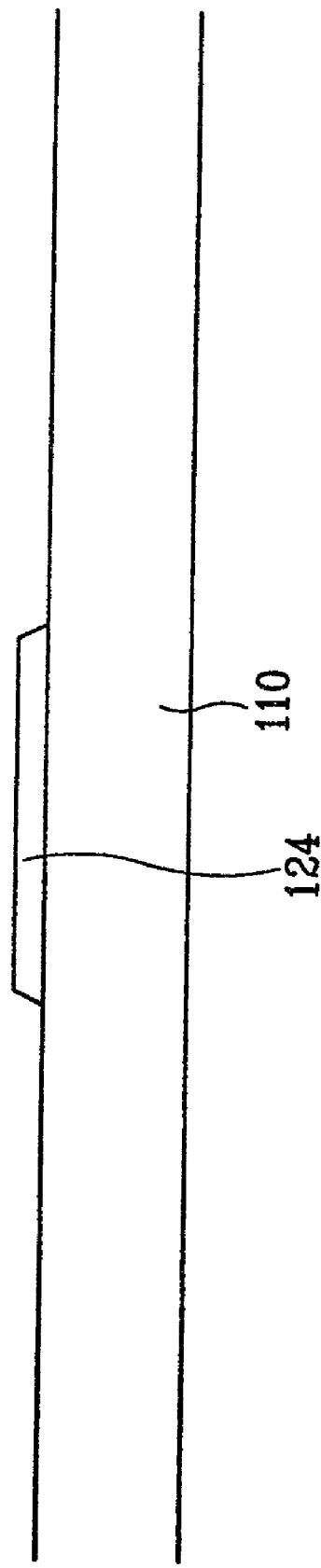

THIN FILM TRANSISTOR ARRAY PANEL

CROSS-REFERENCE TO RELATED APPLICATIONS

This application is a Continuation of U.S. Patent Application No. 11/008,720 filed on Dec. 8, 2004, and now U.S. Pat. No. 7,223,997, which claims priority to and the benefit of Korean Patent Application No. 10 - 2003 - 0089490, filed on Dec. 10, 2003, the disclosures of which are incorporated herein by reference in their entireties.

BACKGROUND OF THE INVENTION (a) Field of the Invention

The present invention relates to a thin film array panel, and in particular, to a thin film transistor array panel for a display device.

(b) Description of the Related Art

A display device such as a liquid crystal display (LCD) and an organic light emitting display (OLED) includes a plurality of pixels arranged in a matrix, and each pixel includes a pixel electrode for displaying images. The pixel electrodes are driven by signals from signal lines including gate lines and data lines that intersect each other to define pixel areas and are connected to the pixel electrodes through switching elements such as thin film transistors (TFTs). The switching elements controls data signals from the data lines in response to scanning signals from the gate lines.

The LCD includes a TFT array panel including the signal lines, the pixel electrodes, and the TFTs and a common electrode panel including a common electrode facing the pixel electrodes and a black matrix having openings facing the pixel areas.

When an active area on a backplane for LCDs is too large to use an exposure mask, the entire exposure is accomplished by repeating a divisional exposure called step-and-repeat process. One divisional exposure unit or area is called a shot. Since transition, rotation, distortion, and etc. are generated during light exposure, the shots are not aligned accurately. Accordingly, parasitic capacitances generated between signal lines and pixel electrodes differ depending on the shots, and this causes the bright difference between the shots, which is recognized at the pixels located at a boundary between the shots. Therefore, the stitch defect is generated on the screen of the LCD due to brightness discontinuity between the shots.

SUMMARY OF THE INVENTION

A motivation of the present invention is to solve the problems of the conventional art.

A thin film array panel is provided, which includes: a gate line formed on a substrate; a first insulating layer formed on the gate line; a semiconductor layer formed on the gate insulating layer; a data line formed on the gate insulating layer and intersecting the gate line; a drain electrode formed at least on the semiconductor layer; a conductor arranged in parallel to the data line; a second insulating layer formed on the data line, the drain electrode, and the conductor and having a first contact hole exposing a portion of the drain electrode; and a pixel electrode formed on the second insulating layer, connected to the drain electrode through the first contact hole, fully covering the data line.

The conductor is preferably floating.

An edge of the pixel electrode is preferably placed on the conductor.

The second insulating layer may include organic material.

The second insulating layer may include a color filter and a passivation film disposed on or under the color filter.

The thin film array panel may further include a light blocking member disposed between the data line and the conductor.

The data line has an edge extending parallel to an edge of the pixel electrode.

The second insulating layer may have second and third contact holes exposing a portion of the data line and the gate line and the thin film transistor array panel may further include first and second contact assistants connected to the data line through the second and the second contact holes.

The second or the third contact hole exposes an edge of the gate line or the data line.

The semiconductor layer may have substantially the same planar shape as the data line and the drain electrode except for a portion disposed between the data line and the drain electrode.

BRIEF DESCRIPTION OF THE DRAWINGS

The present invention will become more apparent by describing embodiments thereof in detail with reference to the accompanying drawings in which:

FIGS. 17A and 17B are sectional views of the TFT array panel shown in FIG. 17A taken along the lines XVIIA-XVIIA' and XVIIB-XVIIB', respectively;

DETAILED DESCRIPTION OF EMBODIMENTS

Figure 1:
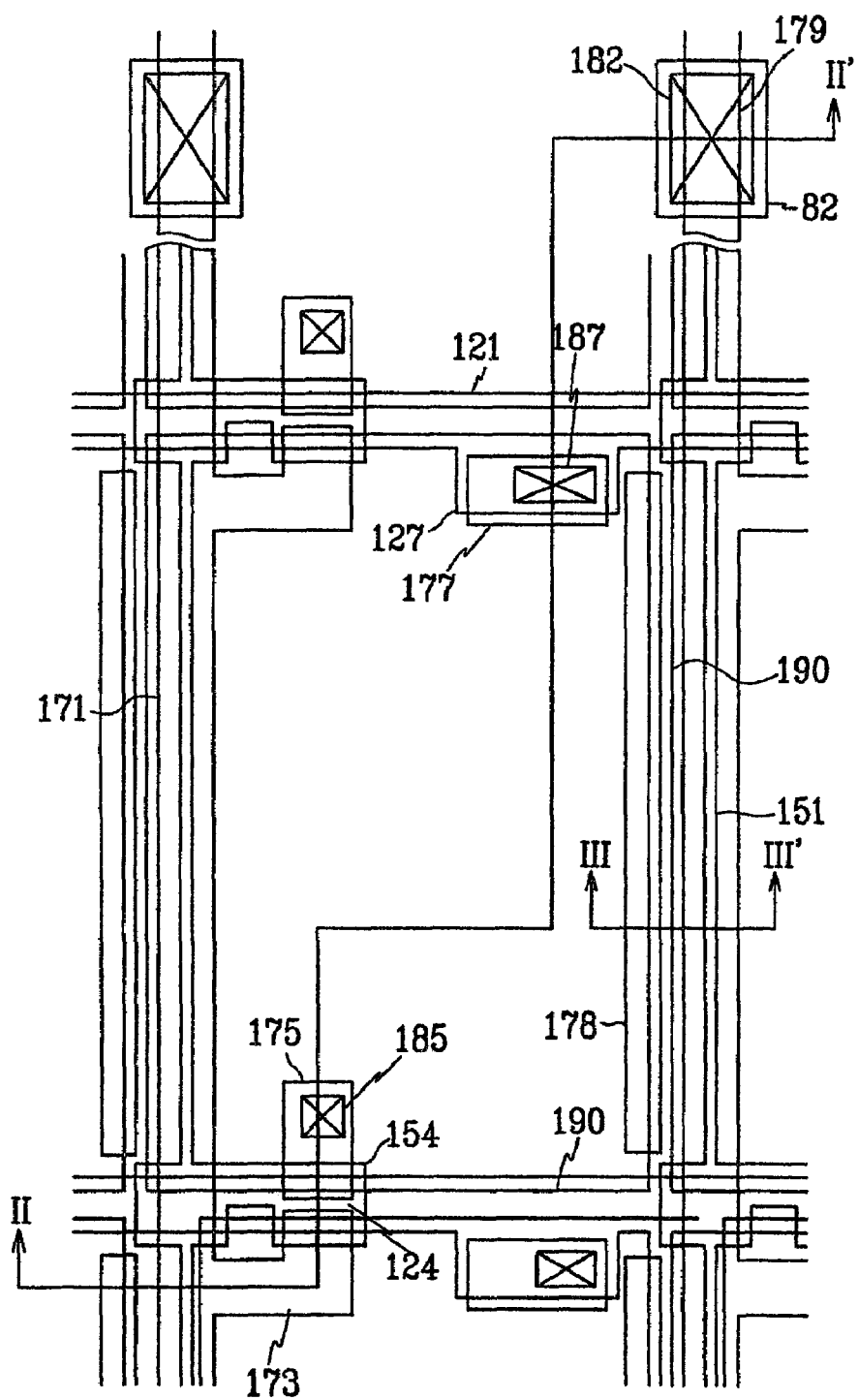
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1-3.

Figure 2:
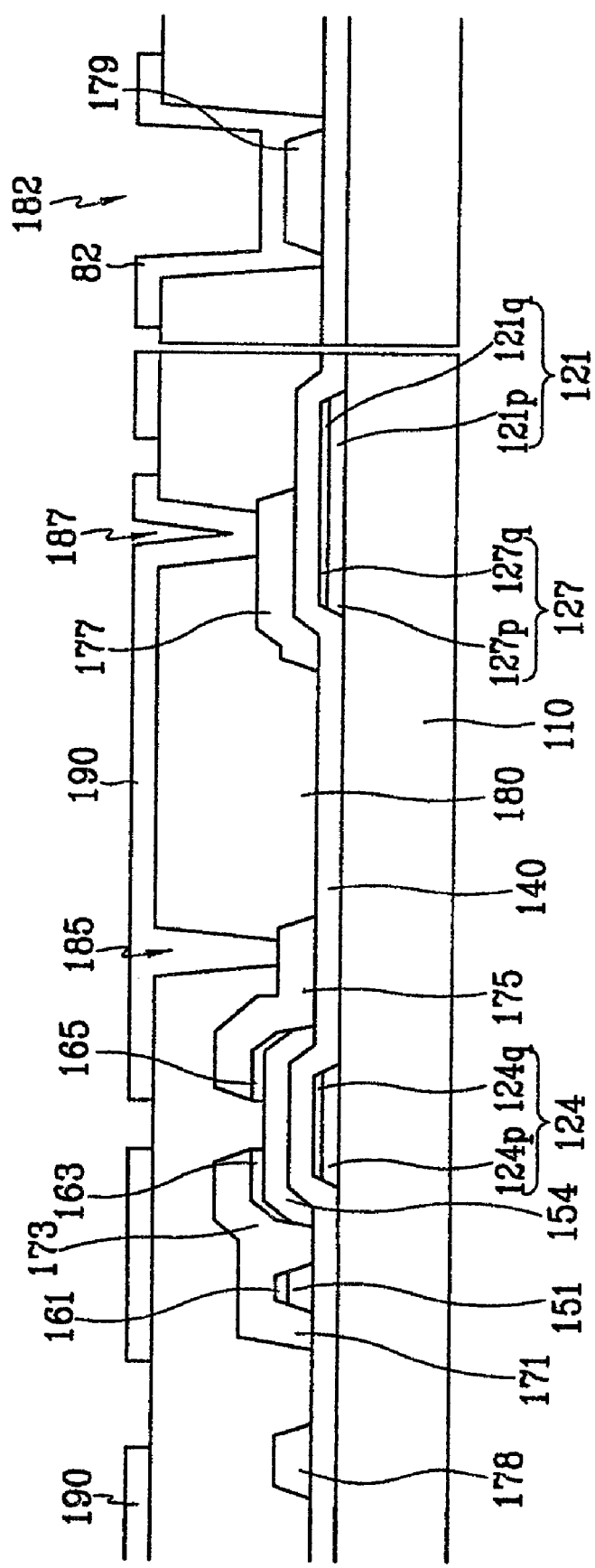
FIG. 2 is a sectional view of the TFT array panel shown in FIG. 1 taken along the line II-II.
Figure 3:
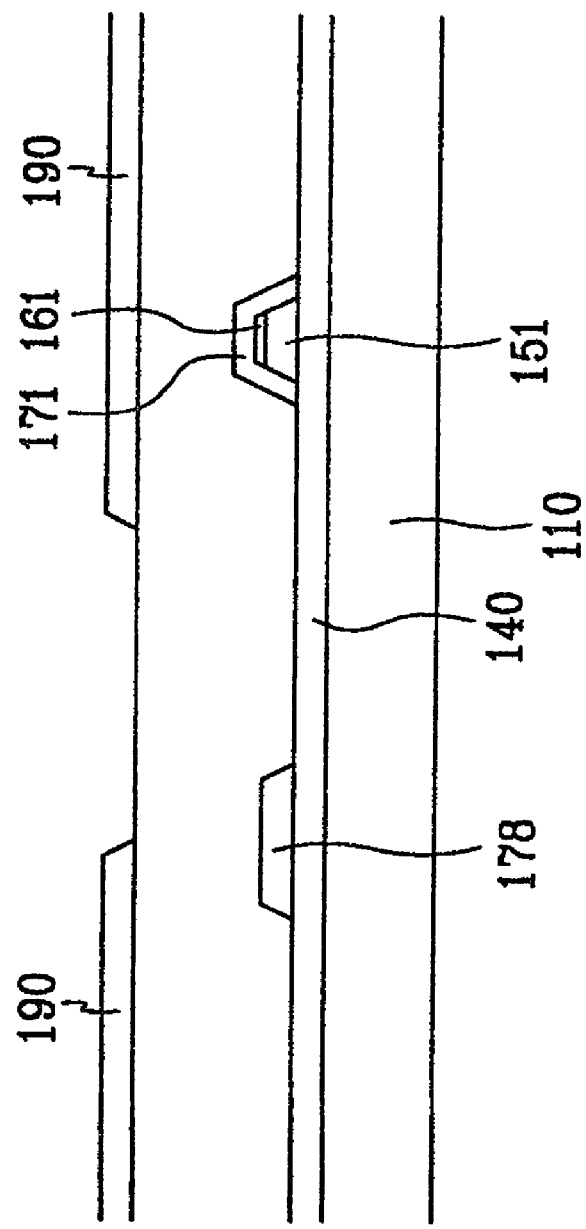
FIG. 3 is a sectional view of the TFT array panel shown in FIG. 1 taken along the line III-III.

FIG. 1 is an exemplary layout view of a TFT array panel according to an embodiment of the present invention, FIG. 2 is a sectional view of the TFT array panel shown in FIG. 1 taken along the line II-II, and FIG. 3 is a sectional view of the TFT array panel shown in FIG. 1 taken along the line III-III.

A plurality of gate lines 121 for transmitting gate signals are formed on an insulating substrate 110. Each gate line 121 extends substantially in a transverse direction and it includes a plurality of portions forming a plurality of gate electrodes 124 and a plurality of projections 127 protruding downward. The gate lines 121 may extend to be connected to a driving circuit (not shown) integrated on the substrate 110, or it may have an end portion (not shown) having a large area for connection with another layer or an external driving circuit mounted on the substrate 110 or on another device such as a flexible printed circuit film (not shown) that may be attached to the substrate 110.

The gate lines 121 include two films having different physical characteristics, a lower film 121p and an upper film 121q, One of the upper and the lower films 121p and 121q is preferably made of low resistivity metal including Al containing metal such as Al and Al alloy, Ag containing metal such as Ag and Ag alloy, and Cu containing metal such as Cu and Cu alloy for reducing signal delay or voltage drop in the gate lines 121. On the other hand, the other of the upper and the lower films 121p and 121q is preferably made of material such as Cr, Mo, Mo alloy, Ta and Ti, which has good physical, chemical, and electrical contact characteristics with other materials such as indium tin oxide (ITO) and indium zinc oxide (IZO). Examples of the combinations are a lower Cr film and an upper Al (or Al—Nd) film and an upper Mo (or Mo alloy) film and a lower Cr film and an upper Al film. In FIG. 2, the lower and the upper films of the gate electrodes 124 are indicated by reference numerals 124p and 124q, respectively, and the lower and the upper films of the projections 127 are indicated by reference numerals 127p and 127q, respectively.

However, the gate lines 121 may include a single layer preferably made of Al containing metal, Ag containing metal, Cu containing metal, Cr, Mo, Mo alloy, Ta, or Ti. Alternatively, the gate lines 121 may have a multi-layered structure including at least three layers that include an intermediate Al layer.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range of about 30-80 degrees.

A plurality of data lines 171, a plurality of drain electrodes 175, a plurality of light blocking conductors 178, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an end portion 179 for contact with another layer or an external device and the end portion 179 may have an increased area for enhancing the contact.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

Each of the light blocking conductors 178 is disposed between adjacent two of the gate lines 121 and extends parallel to the data lines 171. The light blocking conductors 178 are isolated and block light leakage.

The storage capacitor conductors 177 overlap the projections 127 of the gate lines 121.

The data lines 171, the drain electrodes 175, the light blocking conductors 178 and the storage capacitor conductors 177 is preferably made of refractory metal such as Cr, Mo, Ti, Ta and their alloys. However, they may also have a multi-layered structure including a low resistivity layer and a good contact layer.

Like the gate lines 121, the data lines 171, the drain electrodes 175, and the storage capacitor conductors 177 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the drain electrodes 175, the storage electrode capacitors 177, and exposed portions of the semiconductor stripes 151, which are not covered with the data lines 171 and the drain electrodes 175. The passivation layer 180 is preferably made of photosensitive organic material having a good flatness characteristic, or low dielectric insulating material such as a-Si:C:O and a-Si:O:F formed by plasma enhanced chemical vapor deposition (PECVD). The passivation layer 180 may have a double-layered structure including a lower inorganic film preferably made of silicon nitride or silicon oxide and an upper organic film to prevent the direct contact between semiconductor and organic material.

The passivation layer 180 has a plurality of contact holes 182, 185 and 187 exposing the end portions 179 of the data lines 171, the drain electrodes 175, and the storage conductors 177, respectively. The contact holes 182 expose edges of the end portions 179 of the data lines 171 and it is preferable that the contact holes 182 do not expose an Al layer.

A plurality of pixel electrodes 190 and a plurality of contact assistants 82, which are preferably made of ITO or IZO, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The pixel electrodes 190 overlap the gate lines 121 and the data lines 171 to increase aperture ratio although it is optional. The low dielectric passivation layer 180 restricts the increase of parasitic capacitances between the pixel electrodes 190 and the gate lines 121 or the data lines 171 due to the overlapping therebetween.

In addition, each of the pixel electrodes 190 fully covers a data line 171 adjacent thereto and this configuration keeps the parasitic capacitances between the pixel electrodes 190 and the data lines 171 constant under a divisional exposure for forming thin films on the TFT array panel. That is, the overlapping area between a pixel electrode 190 and two data lines 171 adjacent thereto is kept substantially constant although the pixel electrode 190 is aligned to be closer to either of left and right data lines 171. Accordingly, the parasitic capacitances between the pixel electrodes 190 and the data lines 171 in different exposure areas, where the positions of the pixel electrodes 190 relative to the data lines 171 may be different, are substantially equal to each other.

Furthermore, the pixel electrodes 190 overlap the light blocking conductors 178. It is preferable that longitudinal edges of the pixel electrodes 190 overlap the light blocking conductors 178 such that the light blocking conductors 178 are disposed between adjacent two of the pixel electrodes 190. Accordingly, the light blocking conductors 178 can block the light leakage between the pixel electrodes 190 at least in part. Since the light blocking conductors 178 are floating, there is no effective parasitic capacitance between the pixel electrodes 190 and the light blocking conductors 178.

The contact assistants 82 cover the contact holes 182 to be connected to the exposed end portions 179 of the data lines 171 through the contact holes 182. The contact assistants 82 protect the exposed portions 179 and complement the adhesion between the exposed portions 179 and external devices.

The pixel electrodes 190 may be made of transparent conductive polymer or made of opaque reflective metal for a reflective LCD. In these cases, the contact assistants 82 may be made of material such as ITO or IZO different from the pixel electrodes 190.

A TFT array panel for an LCD according to another embodiment of the present invention will be described in detail with reference to FIGS. 4 and 5.

Figure 4:
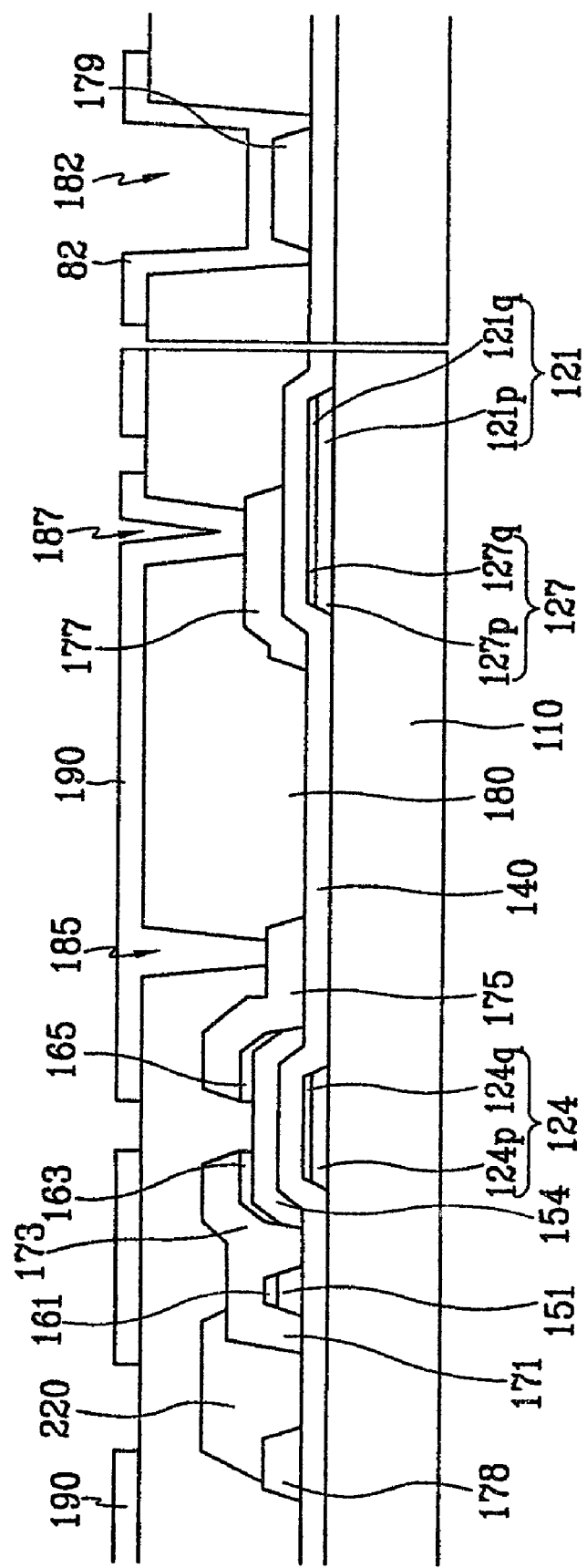
FIGS. 4 and 5 are sectional views of the TFT array panel shown in FIG. 1 according to another embodiment of the present invention taken along the lines II-II' and III-III', respectively.
Figure 5:
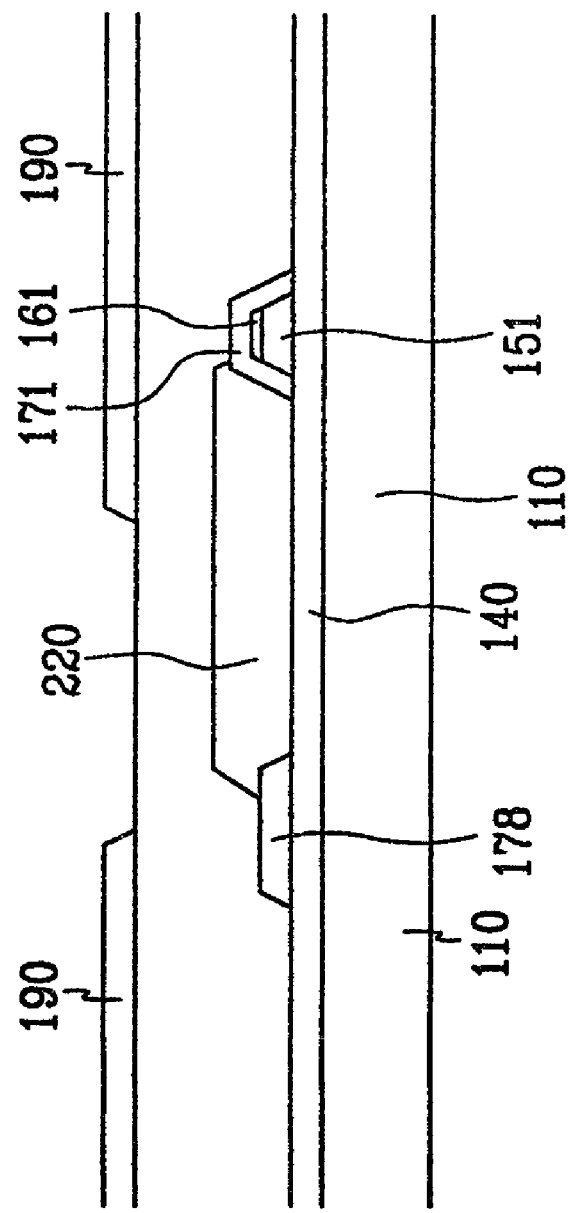

FIGS. 4 and 5 are sectional views of the TFT array panel shown in FIG. 1 according to another embodiment of the present invention taken along the lines II-II' and III-III', respectively.

Referring to FIGS. 4 and 5, a layered structure of the TFT array panel according to this embodiment is almost the same as those shown in FIGS. 2 and 3.

That is, a plurality of gate lines 121 including a plurality of gate electrodes 124 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, a plurality of light blocking conductors 178, and a plurality of storage capacitor conductors 177 are formed on the ohmic contacts 161 and 165 and the gate insulating layer 140, and a passivation layer 180 are formed thereon. A plurality of contact holes 182 and 185 are provided at the passivation layer 180, and a plurality of pixel electrodes 190 and a plurality of contact assistants 82 are formed on the passivation layer 180.

Different from the TFT array panel shown in FIGS. 1 and 2, the TFT array panel according to this embodiment provides a plurality of light blocking members 220 between the data lines 171 and the light blocking conductors 178. The light blocking members 220 are preferably made of insulating material containing black pigment or chromium nitride. The light blocking members 220 block the light leakage between the pixel electrodes 190, and, in particular, between the pixel electrodes 190 and the light blocking conductors 178 adjacent thereto. The light blocking members 220 are disposed on the data lines 171, the light blocking conductors 178, and the gate insulating layer 140, but they may be disposed under the gate insulating layer 140 or on the passivation layer 180 or the pixel electrodes 190.

A method of manufacturing the TFT array panel shown in FIGS. 1-3 according to an embodiment of the present invention will be now described in detail with reference to FIGS. 6 to 13 as well as FIGS. 1-3.

FIGS. 6, 8, 10 and 12 are layout views of the TFT array panel shown in FIGS. 1-3 in intermediate steps of a manufacturing method thereof according to an embodiment of the present invention, and FIGS. 7, 9, 11 and 13 are sectional views of the TFT array panel shown in FIGS. 6, 8, 10 and 12 taken along the lines VII-VIF, IX-IX', XI-XI', and XIII-XIII', respectively.

Two conductive films, a lower conductive film and an upper conductive film are sputtered in sequence on an insulating substrate 110 such as transparent glass. The lower conductive film is preferably made of a metal such as Cr, Mo, and Mo alloy, which has good contact characteristics with ITO or IZO, and it has a thickness of about 500 Å. The upper conductive film is preferably made of Al containing metal and preferably has a thickness of about 2,500 Å.

Figure 6:
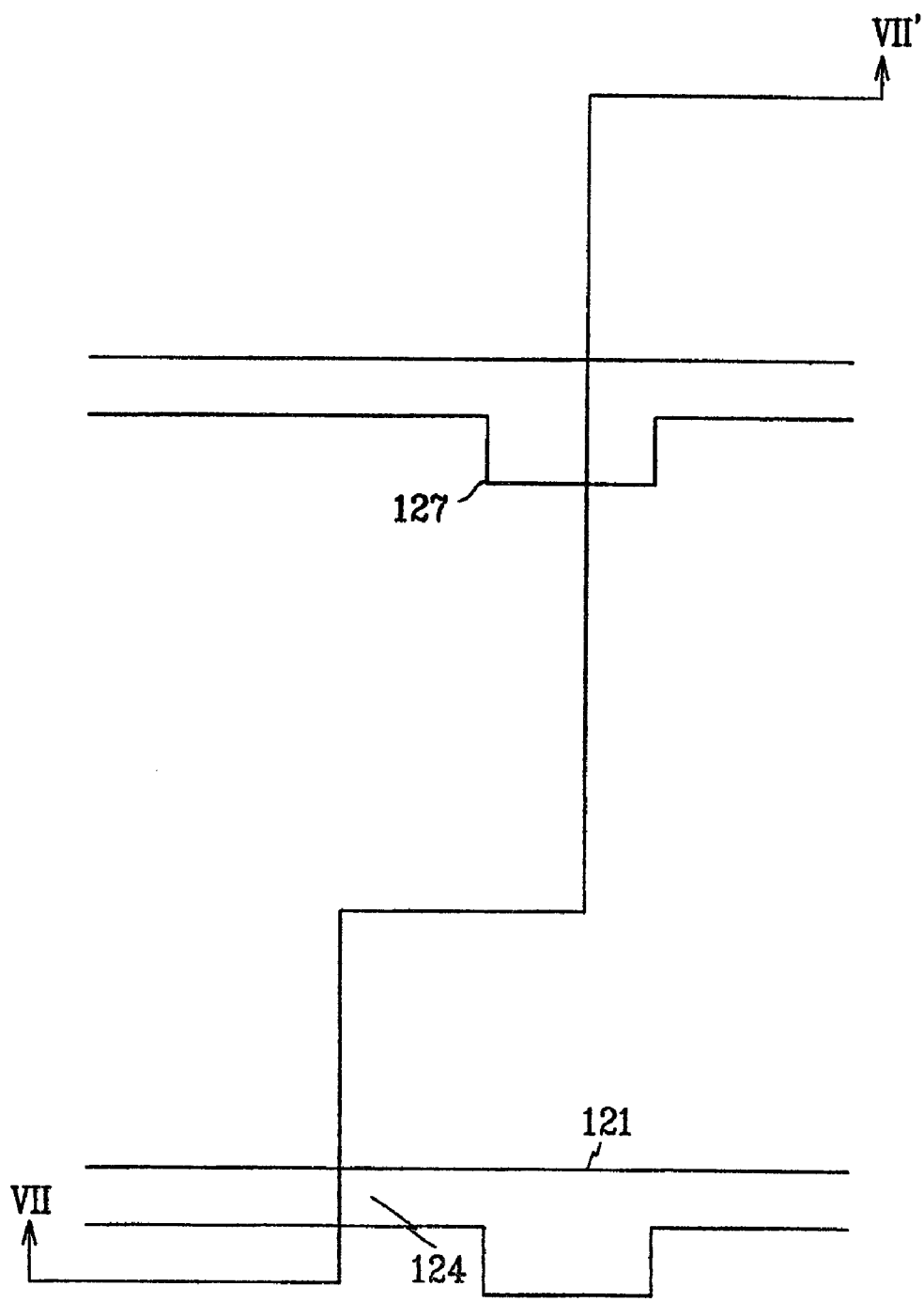
FIGS. 6, 8, 10 and 12 are layout views of the TFT array panel shown in FIGS. 1-3 in intermediate steps of a manufacturing method thereof according to an embodiment of the present invention.
Figure 7:
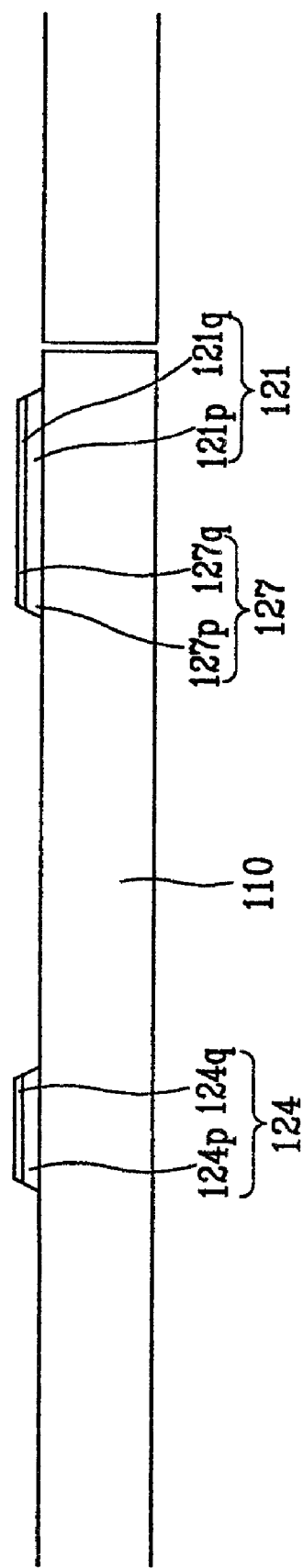
FIGS. 7, 9, 11 and 13 are sectional views of the TFT array panel shown in FIGS. 6, 8, 10 and 12 taken along the lines VII-VII', IX-IX', XI-XI', and XIII-XIII', respectively.

Referring to FIGS. 6 and 7, the upper conductive film and the lower conductive film are patterned in sequence by photo-etching with a photoresist pattern to form a plurality of gate lines 121 including a plurality of gate electrodes 124 and a plurality of projections 127. Although the lower and the upper films 121$p$ and 121$q$ may be separately etched under different conditions, they may be simultaneously etched preferably using an Al etchant including 8-15% $CH_3COOH$, 5-8% $HNO_3$, 50-60% $H_3PO_4$, and remaining $H_2O$, which gives inclined edge profiles. The above-described etchant can also etch Mo with giving inclined etch profiles.

Figure 8:
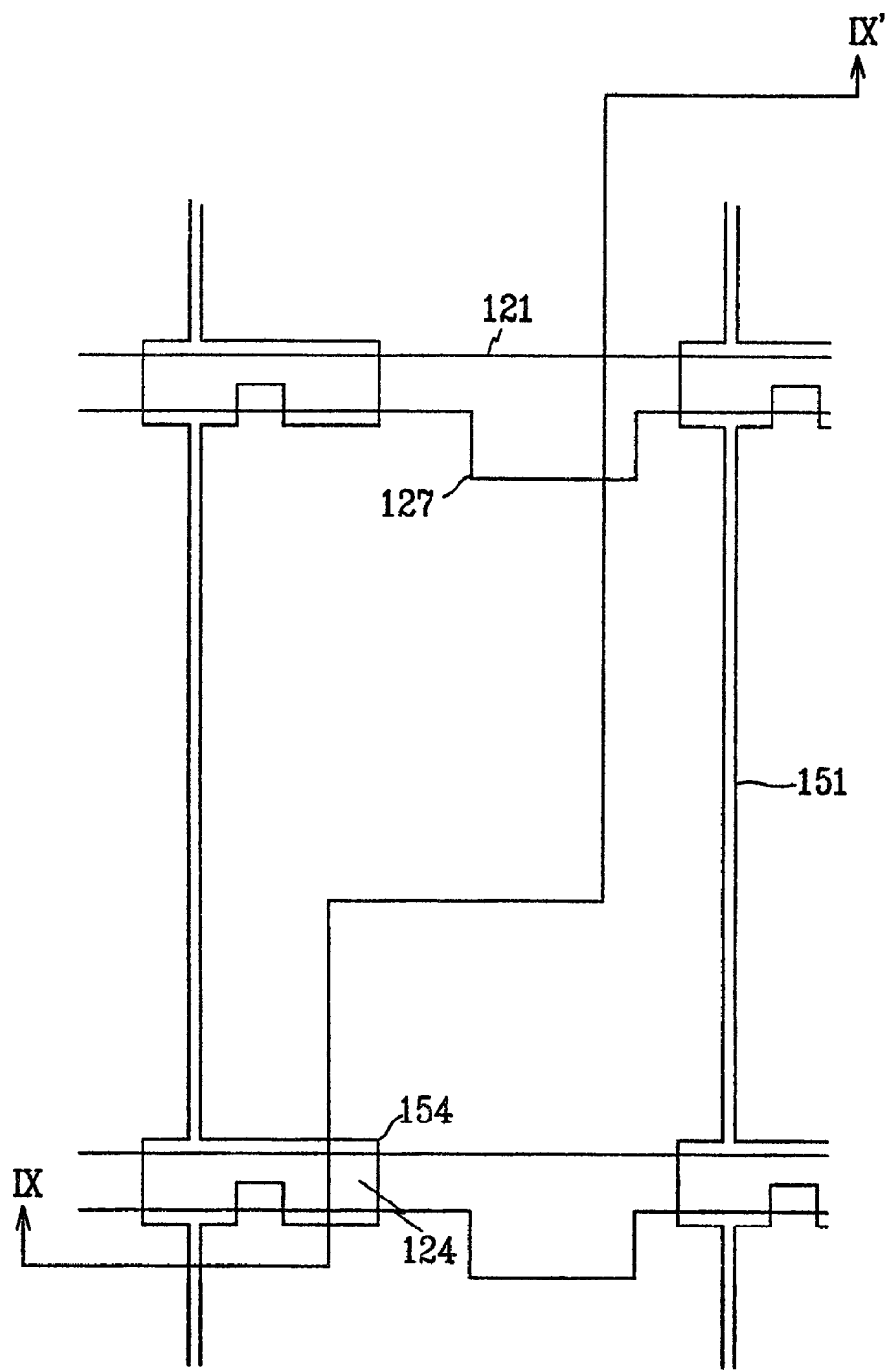
Figure 9:
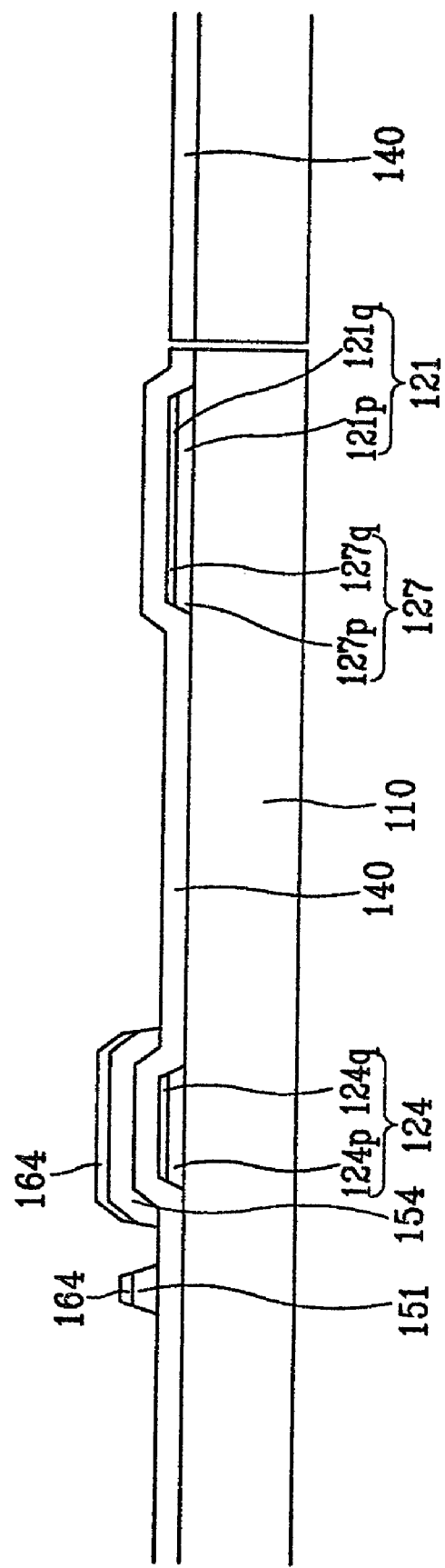

Referring to FIGS. 8 and 9, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,000 Å to about 5,000 Å, and the deposition temperature is preferably in a range of about 250-500° C.

Figure 10:
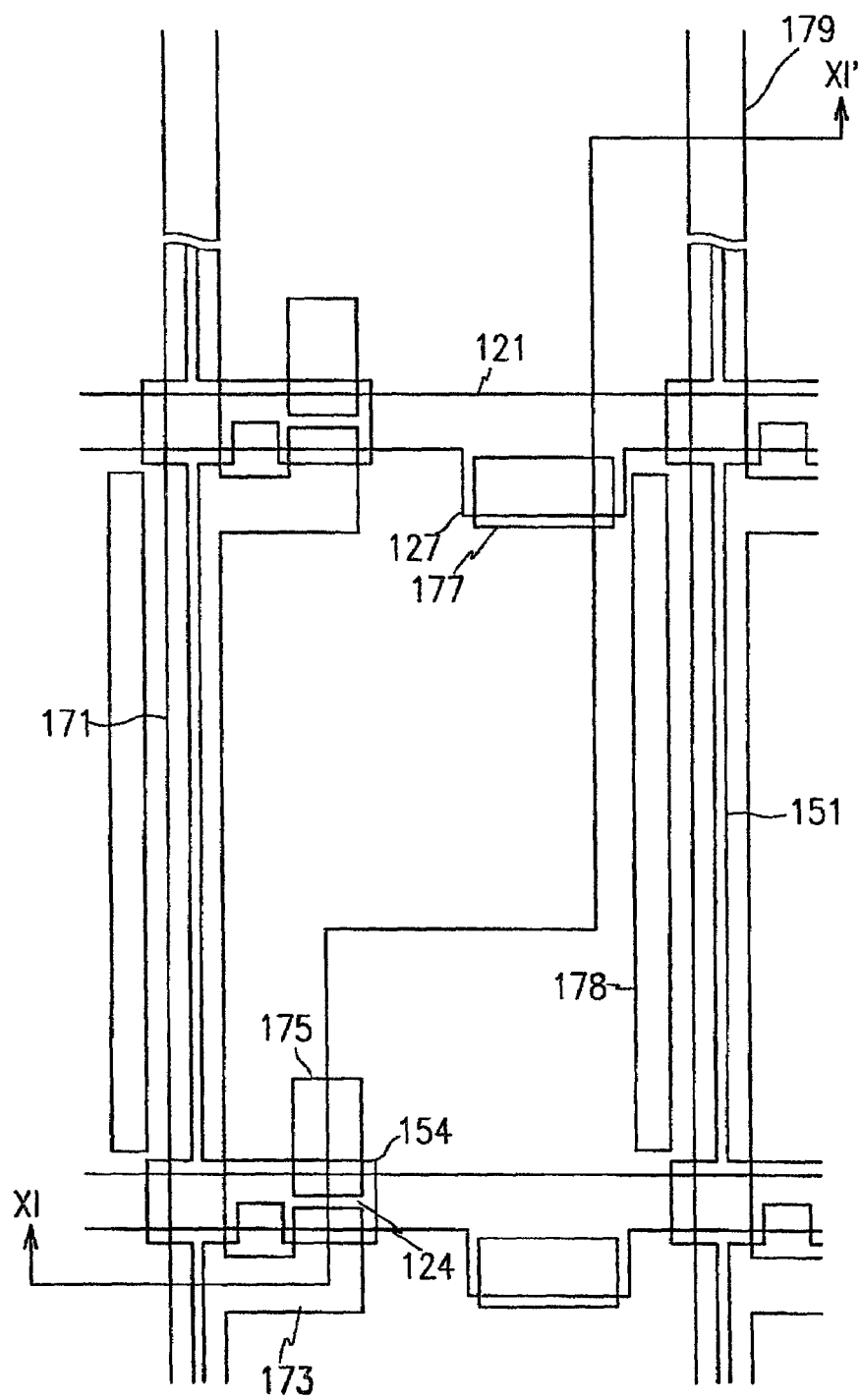
Figure 11:
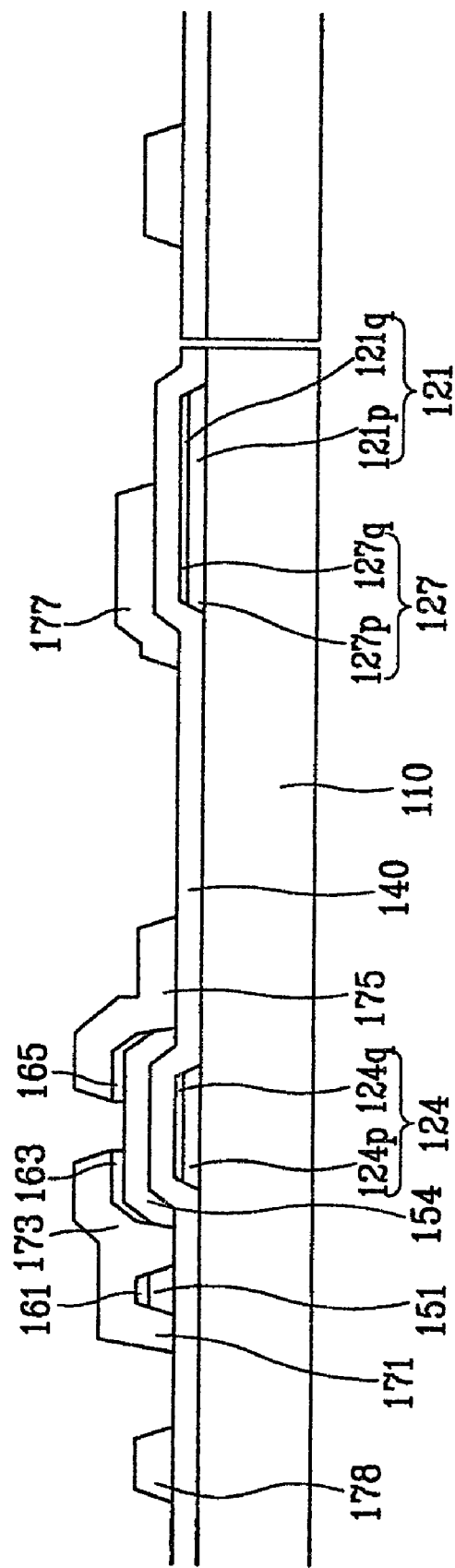

Referring to FIGS. 9 and 10, a conductive layer is sputtered and etched using a photoresist film (not shown) to form a plurality of data lines 171 including a plurality of source electrodes 173, a plurality of drain electrodes 175, a plurality of light blocking conductors 178, and a plurality of storage capacitor conductors 177.

Before or after removing the photoresist film, portions of the extrinsic semiconductor stripes 164, which are not covered with the data lines 171, the drain electrodes 175, the light blocking conductors 178, and the storage capacitor conductors 177, are removed by etch to complete a plurality of ohmic contact stripes 161 including a plurality of projections 163 and a plurality of ohmic contact islands 165 and to expose portions of the intrinsic semiconductor stripes 151. In case that the exposed portions of the extrinsic semiconductor stripes 164 is removed using the data lines 171, the drain electrodes 175, the light blocking conductors 178, and the storage capacitor conductors 177 as an etch mask after removing the photoresist film, the extrinsic semiconductor stripes 164 are dry etched preferably using $CF_4$+HCl in order to prevent the damage on the Mo containing films of the datalines 171, etc.

Oxygen plasma treatment may follow thereafter in order to stabilize the exposed surfaces of the semiconductor stripes 151.

Figure 12:
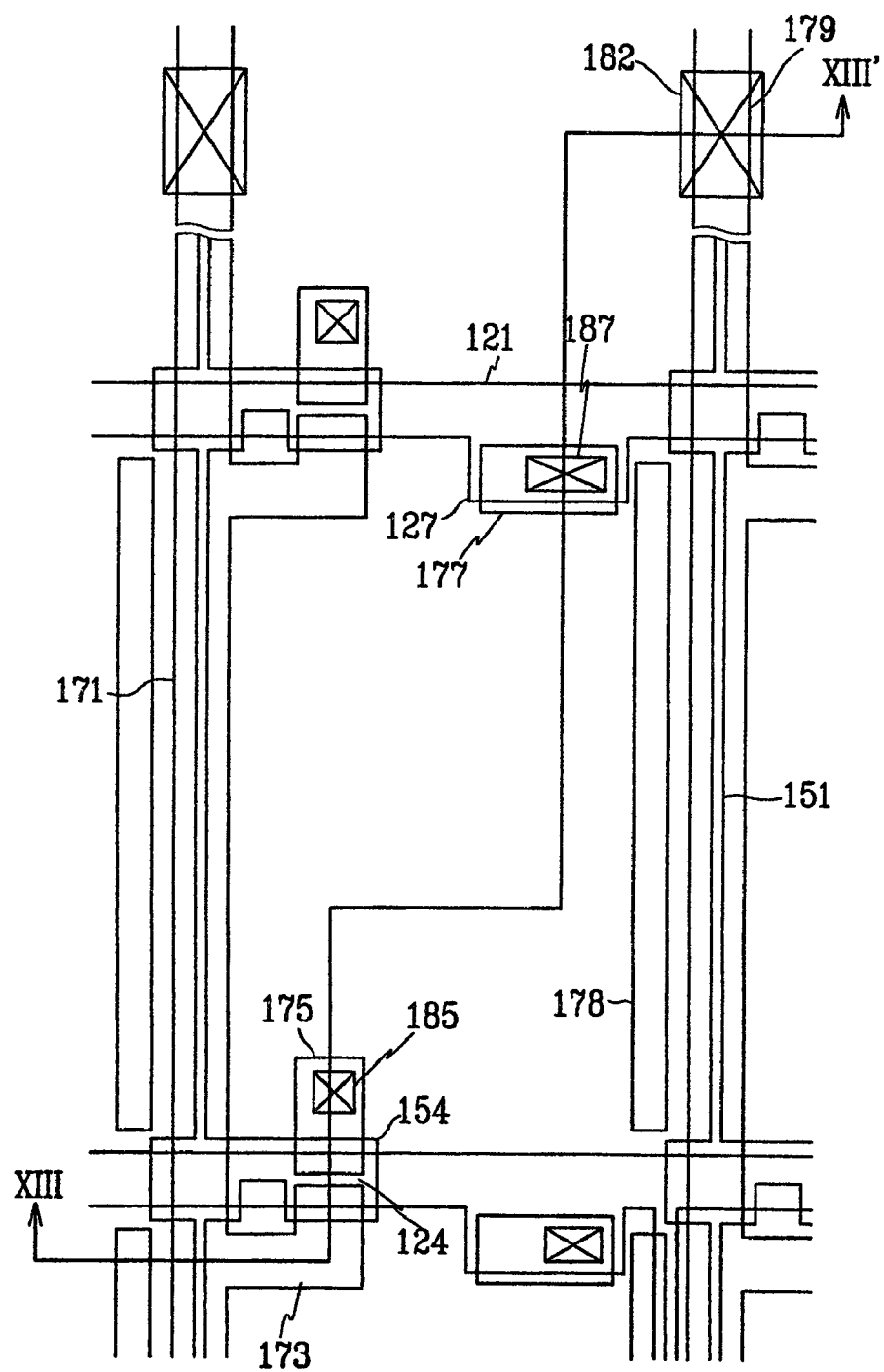
Figure 13:
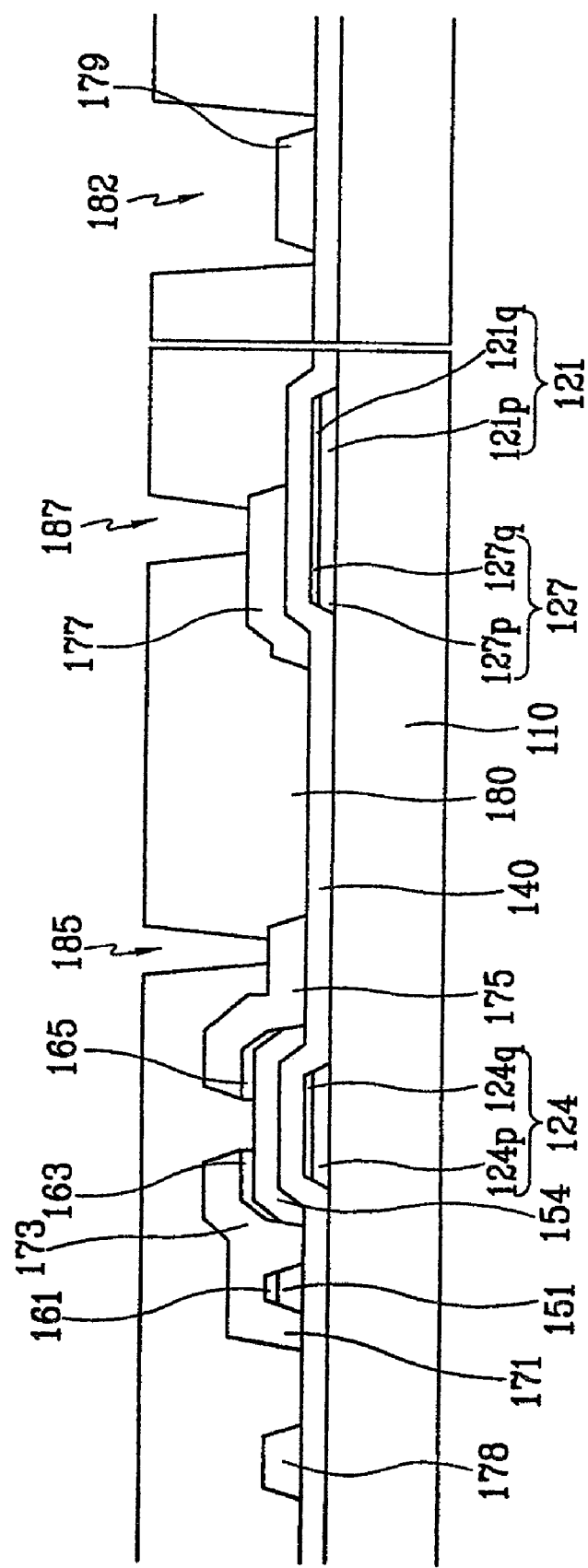

Referring to FIGS. 12 and 13, a passivation layer 180 made of photosensitive organic material is coated and subjected to light exposure and development to form a plurality of contact holes 182, 185 and 187 exposing the end portions 179 of the data lines 171, the drain electrodes 175, and the storage capacitor conductors 177.

Referring to FIGS. 1-3, a transparent conductive layer made of ITO or IZO is sputtered and photo-etched to form a plurality of pixel electrodes 190 and a plurality of contact assistants 82 are formed on the passivation layer 180.

A TFT array panel for an LCD according to another embodiment of the present invention will be described in detail with reference to FIGS. 14, 15A and 15B.

Figure 14:
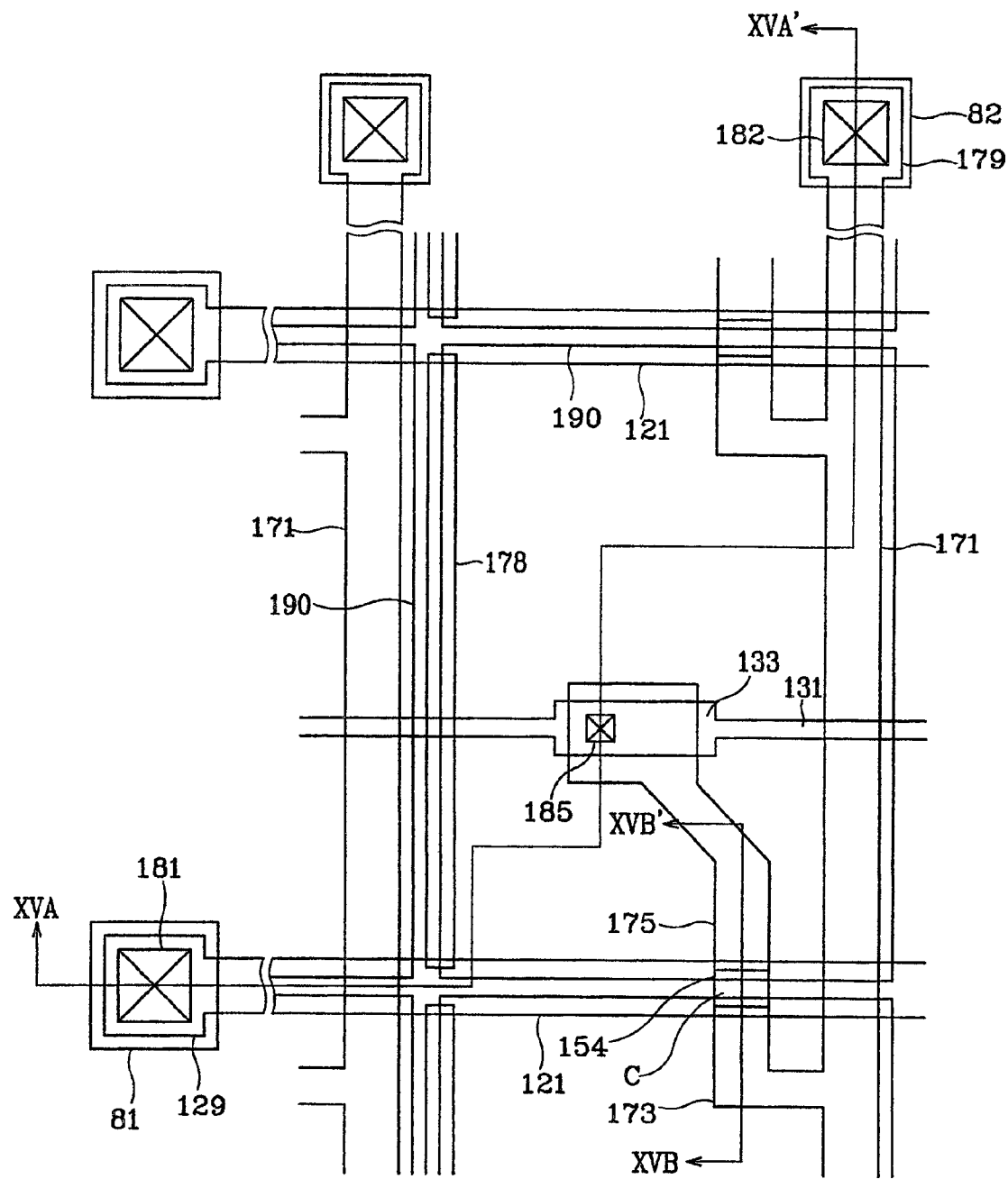
FIG. 14 is a layout view of a TFT array panel for an LCD according to another embodiment of the present invention.
Figure 15A:
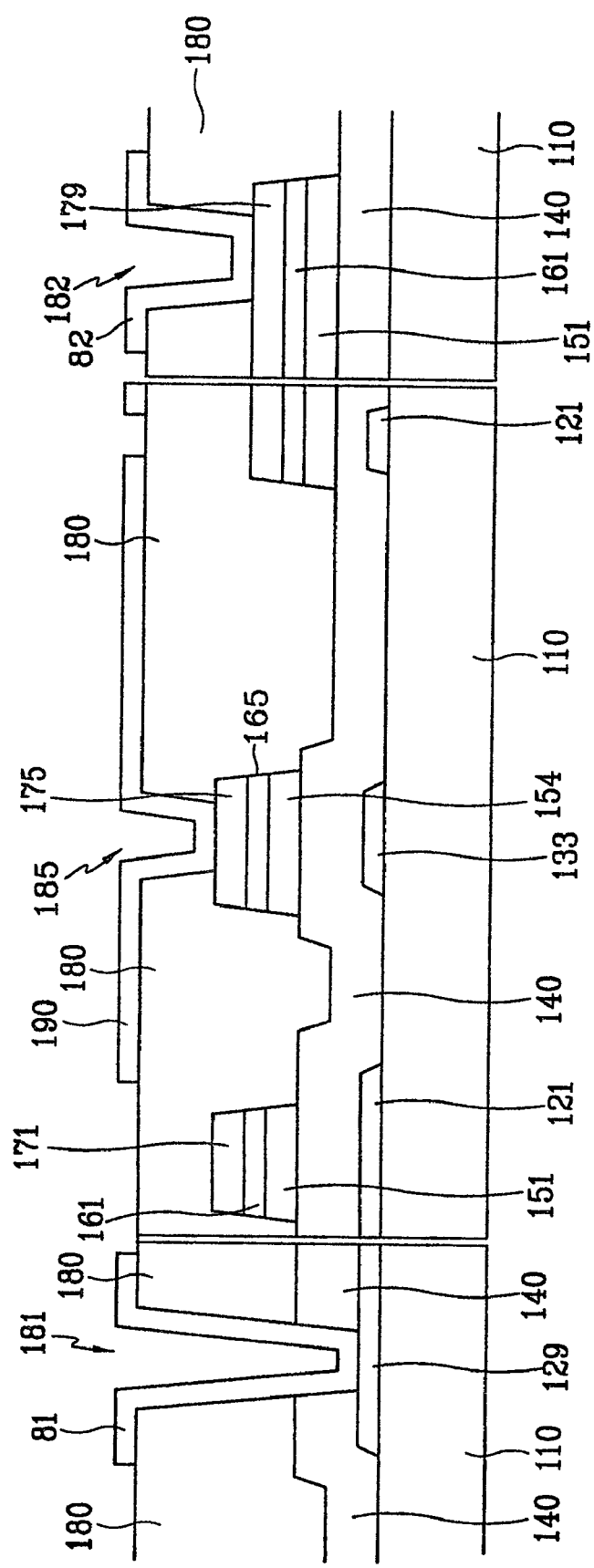
FIG. 15A is a sectional view of the TFT array panel shown in FIG. 14 taken along the line XVA-XVA'.
Figure 15B:
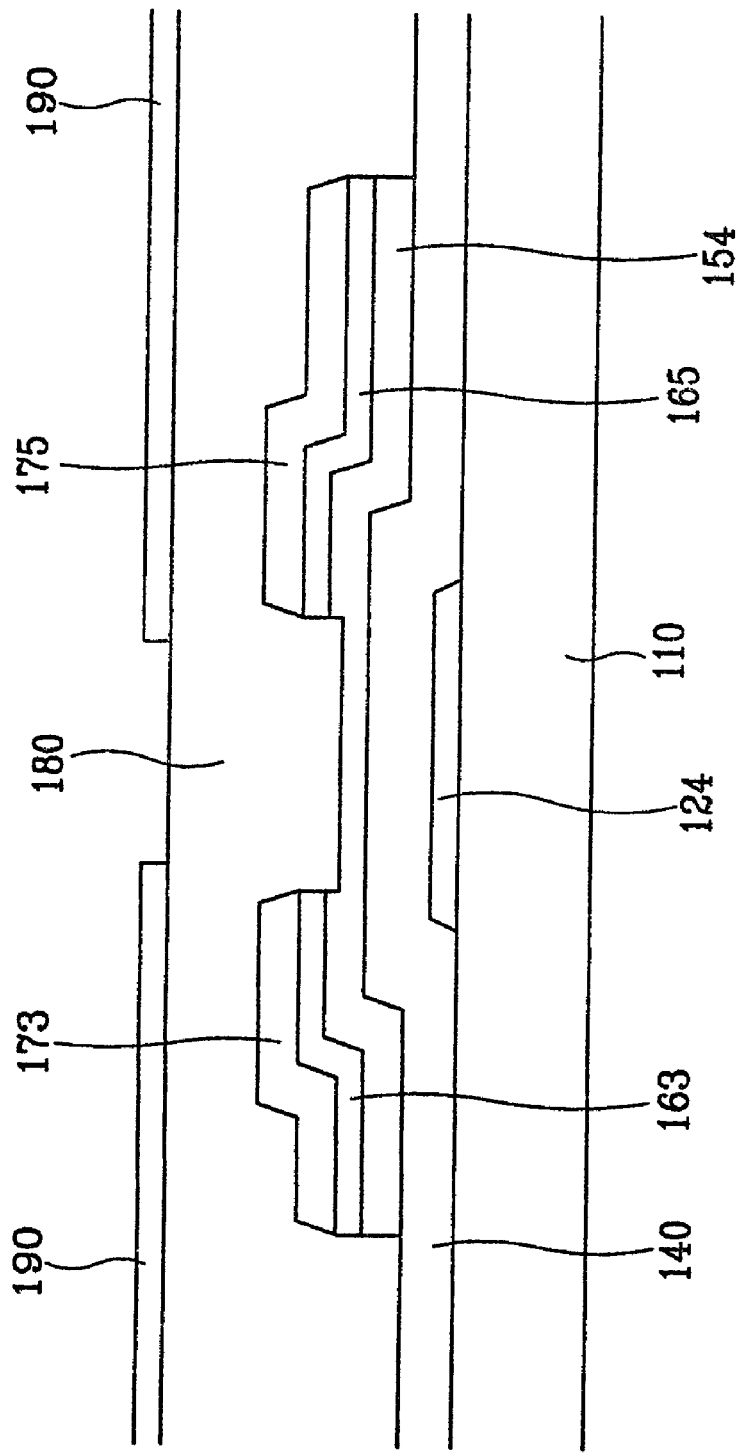
FIG. 15B is a sectional view of the TFT array panel shown in FIG. 14 taken along the lines XVB-XVB'.

FIG. 14 is a layout view of a TFT array panel for an LCD according to another embodiment of the present invention, FIG. 15A is a sectional view of the TFT array panel shown in FIG. 14 taken along the line XVA-XVA', and FIG. 15B is a sectional view of the TFT array panel shown in FIG. 14 taken along the lines XVB-XVB'.

Referring to FIGS. 14-15B, a layered structure of the TFT array panel according to this embodiment is almost the same as that shown in FIGS. 1-3.

That is, a plurality of gate lines 121 including a plurality of gate electrodes 124 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of light blocking conductors 178, and a plurality of drain electrodes 175 are formed on the ohmic contacts 161 and 165, and a passivation layer 180 are formed thereon. A plurality of contact holes 182 and 185 are provided at the passivation layer 180, and a plurality of pixel electrodes 190 and a plurality of contact assistants 82 are formed on the passivation layer 180.

Different from the TFT array panel shown in FIGS. 1-3, the TFT array panel according to this embodiment provides a plurality of storage electrode lines 131, which are separated from the gate lines 121, on the same layer as the gate lines 121 without providing projections at the gate lines 121. The storage electrode lines 131 are supplied with a predetermined voltage such as the common voltage. Without providing the storage capacitor conductors 177 shown in FIGS. 1-3, the storage electrode lines 131 includes a plurality of storage electrodes 133 having a large area and the drain electrodes 175 extend to overlap the storage electrodes 133 to form storage capacitors. The storage electrode lines 131 may be omitted if the storage capacitance generated by the overlapping of the gate lines 121 and the pixel electrodes 191 is sufficient. The storage electrode lines 131 may be disposed near the gate lines 121 to increase the aperture ratio.

In addition, the semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Furthermore, the TFT array panel further includes a plurality of semiconductor islands (not shown) and a plurality of ohmic contact islands (not shown) disposed thereon, which are disposed on the light blocking conductors 179.

Moreover, the gate lines 121 and the storage electrode lines 131 have a single layer structure and the gate lines 121 and the data lines 171 have expanded end portions 129 and 179, respectively. Accordingly, a plurality of contact holes 181 exposing the end portions 129 of the gate lines 121 are provided at the gate insulating layer 140 and the passivation layer 180, and a plurality of contact assistants 81 connected to the end portions 129 through the contact holes 181 are additionally provided.

Many of the above-described features of the TFT array panel for an LCD shown in FIGS. 1-3 may be appropriate to the TFT array panel shown in FIGS. 14-15B.

Now, a method of manufacturing the TFT array panel shown in FIGS. 14-15B according to an embodiment of the present invention will be described in detail with reference to FIGS. 16-23B as well as FIGS. 14-15B.

Figure 16:
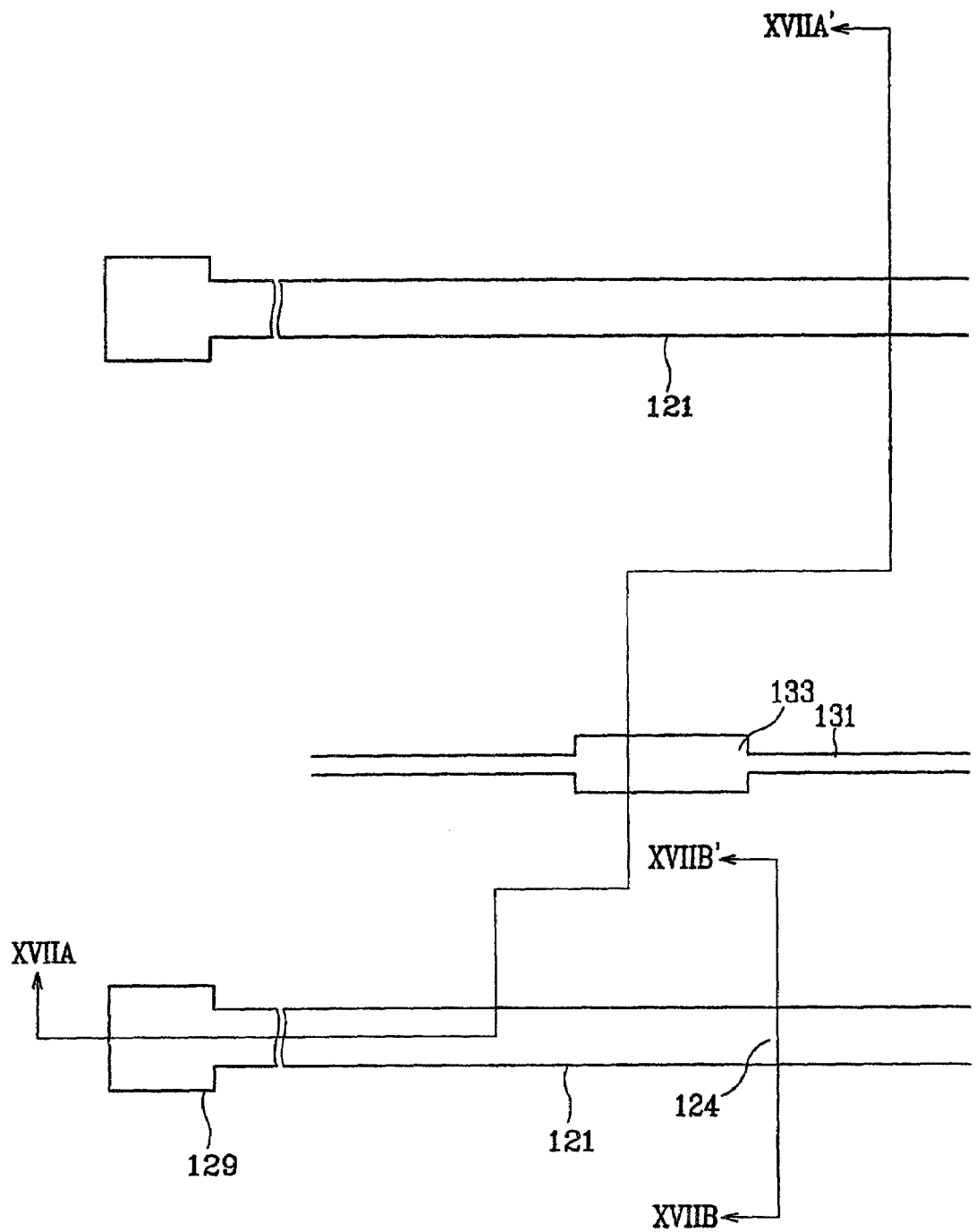
FIG. 16 is a layout view of a TFT array panel shown in FIGS. 14-15B in the first step of a manufacturing method thereof according to an embodiment of the present invention.
Figure 17A:
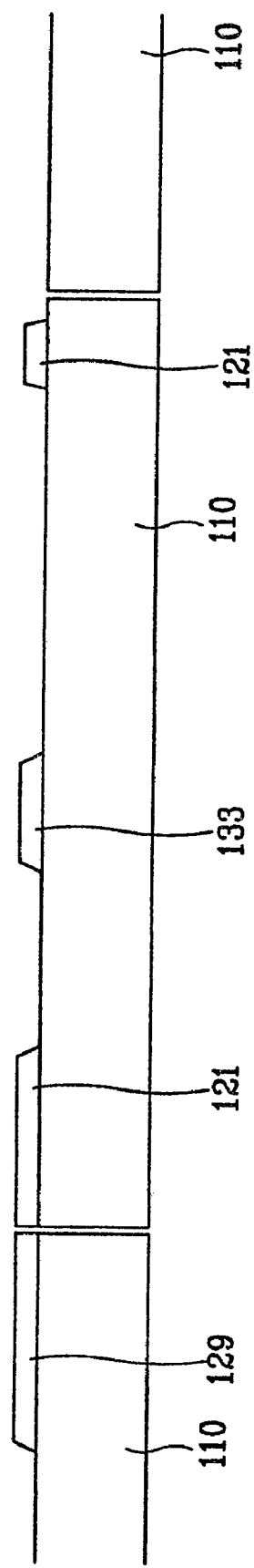
Figure 18A:
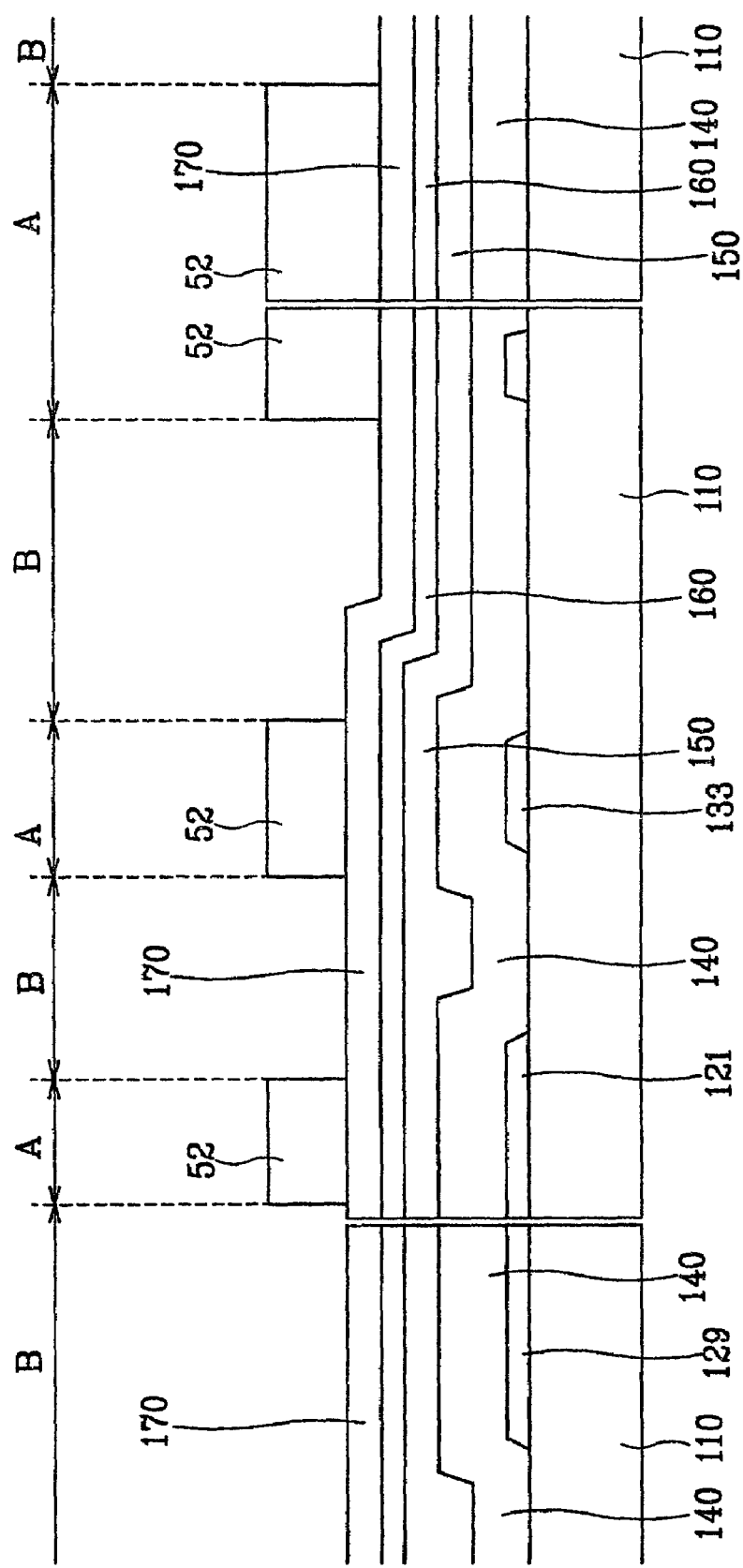
FIGS. 18A and 18B are sectional views of the TFT array panel shown in FIG. 16 taken along the lines XVIIA-XVIIA' and XVIIB-XVIIB', respectively, and illustrate the step following the step shown in FIGS. 17A and 17B.
Figure 18B:
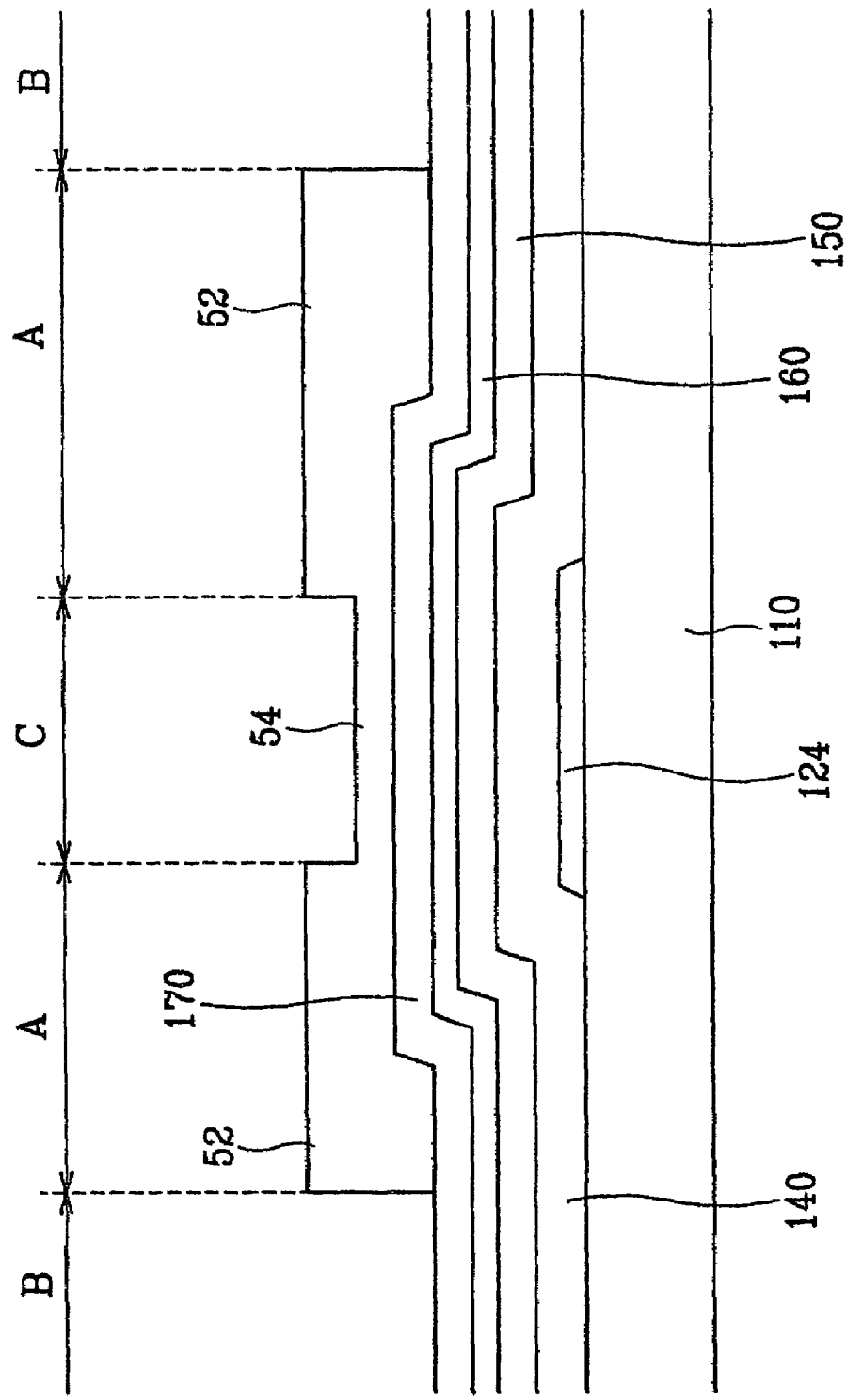
Figure 19A:
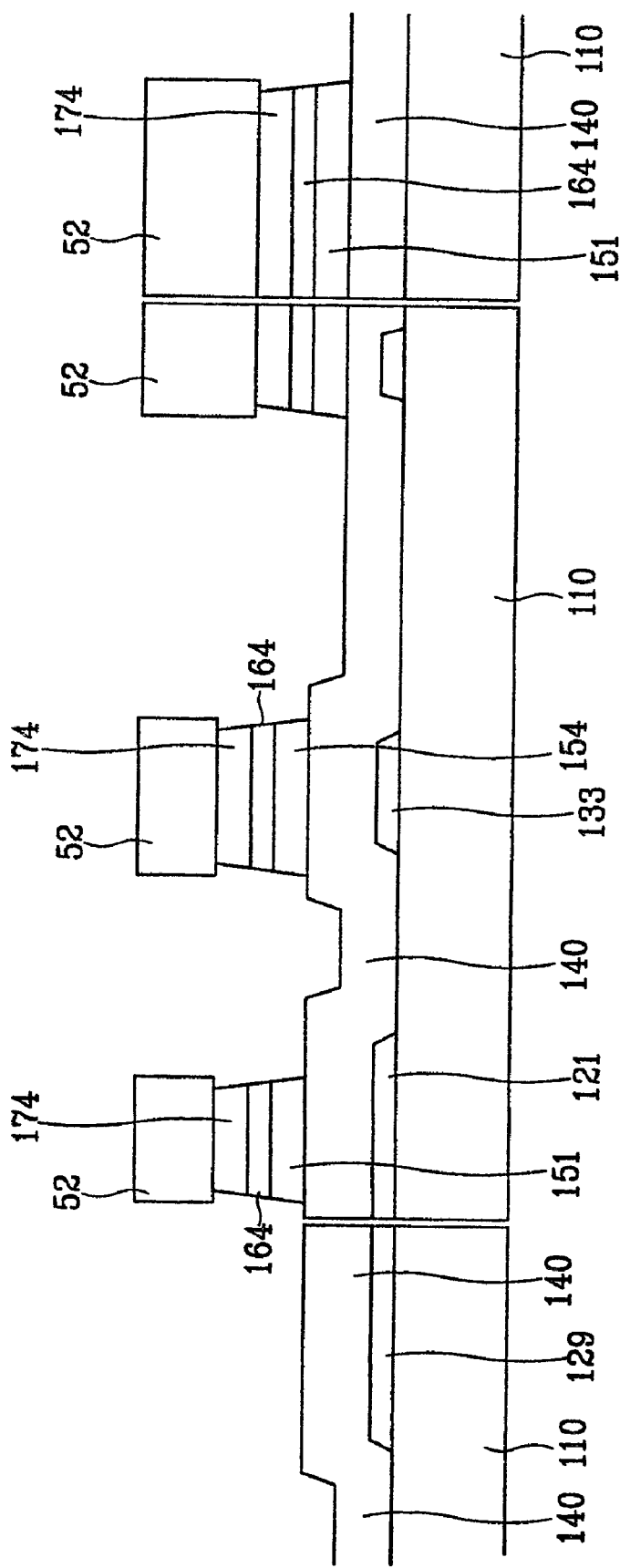
FIGS. 19A and 19B are sectional views of the TFT array panel shown in FIG. 16 taken along the lines XVIIA-XVIIA' and XVIIB-XVIIB', respectively, and illustrate the step following the step shown in FIGS. 18A and 18B.
Figure 19B:
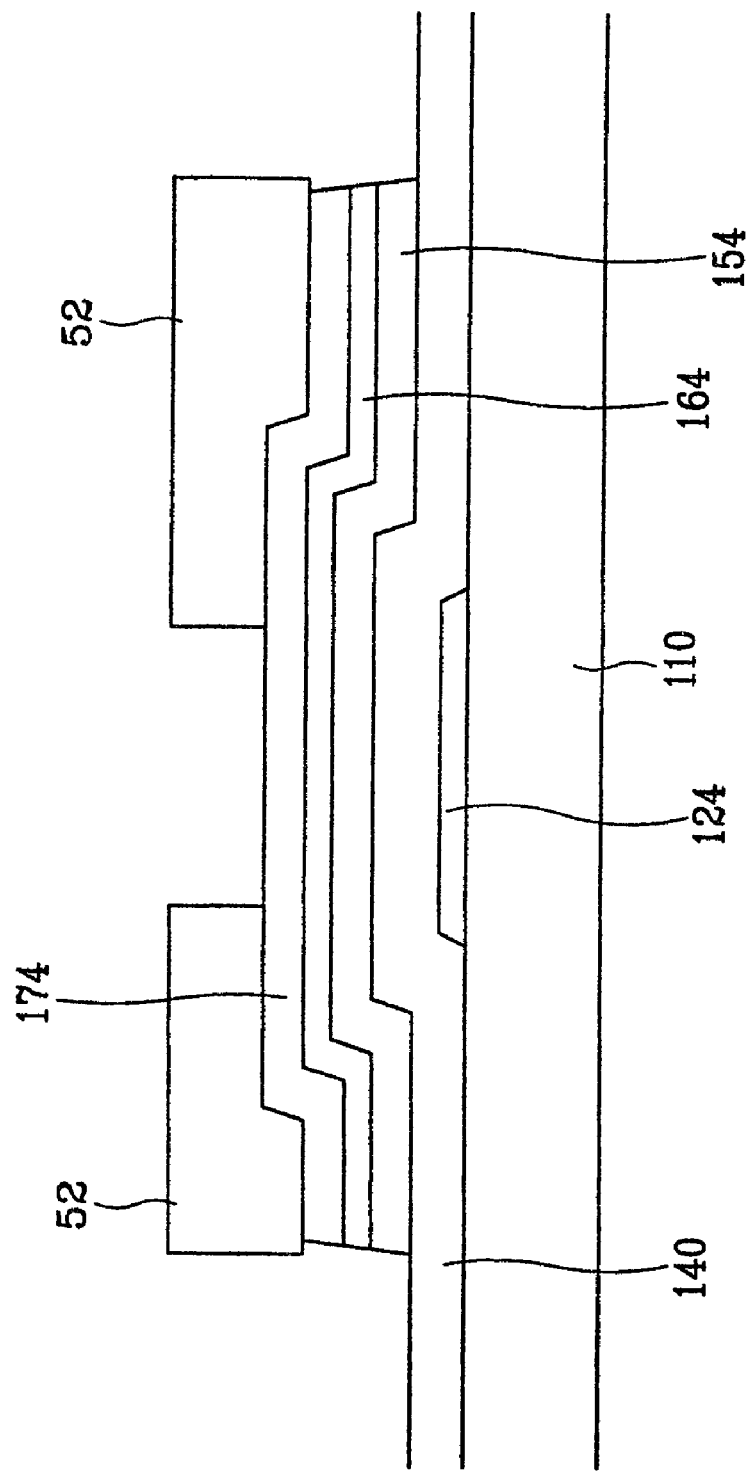
Figure 20:
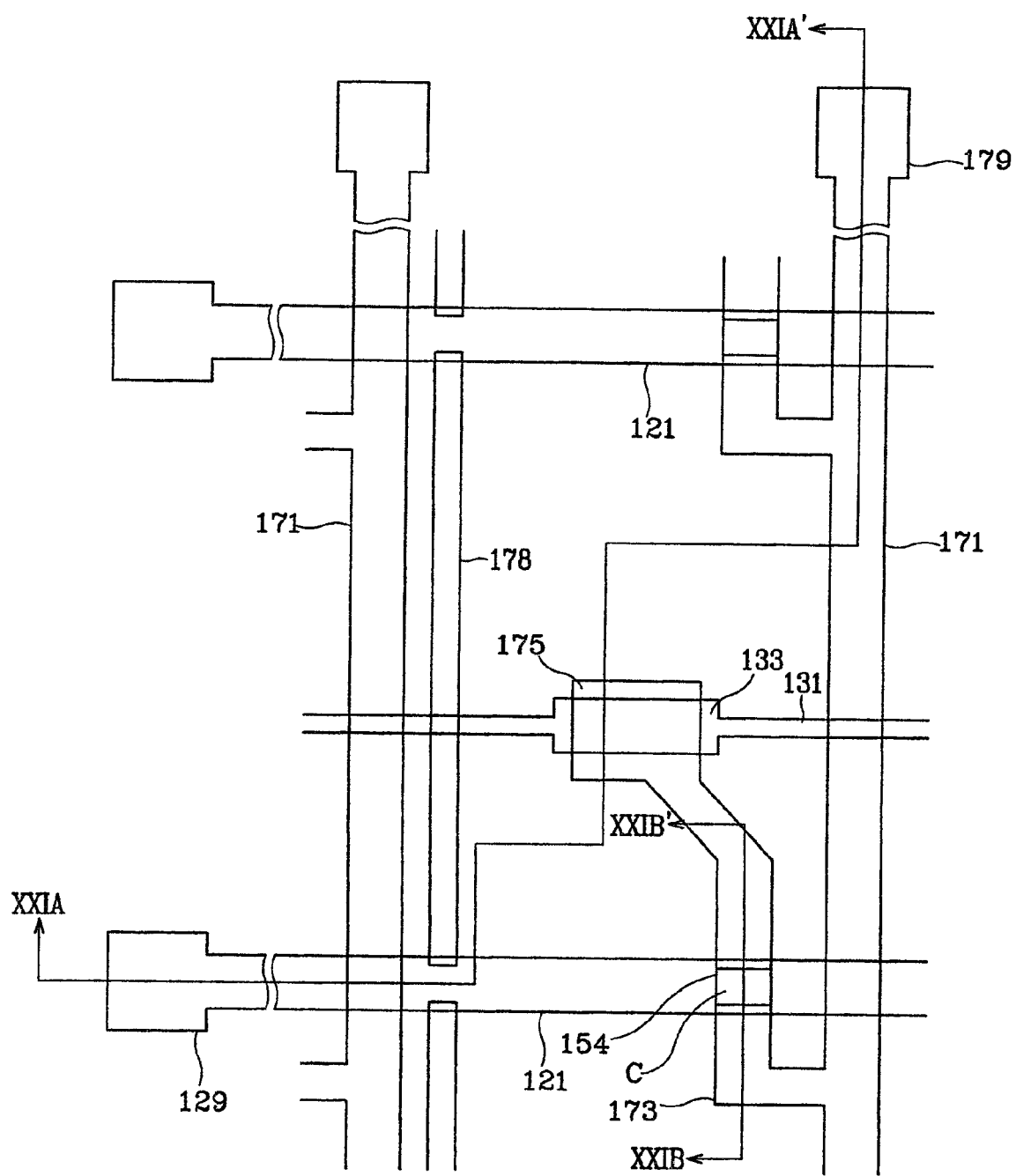
FIG. 20 is a layout view of the TFT array panel in the step following the step shown in FIGS. 19A and 19B.
Figure 21A:
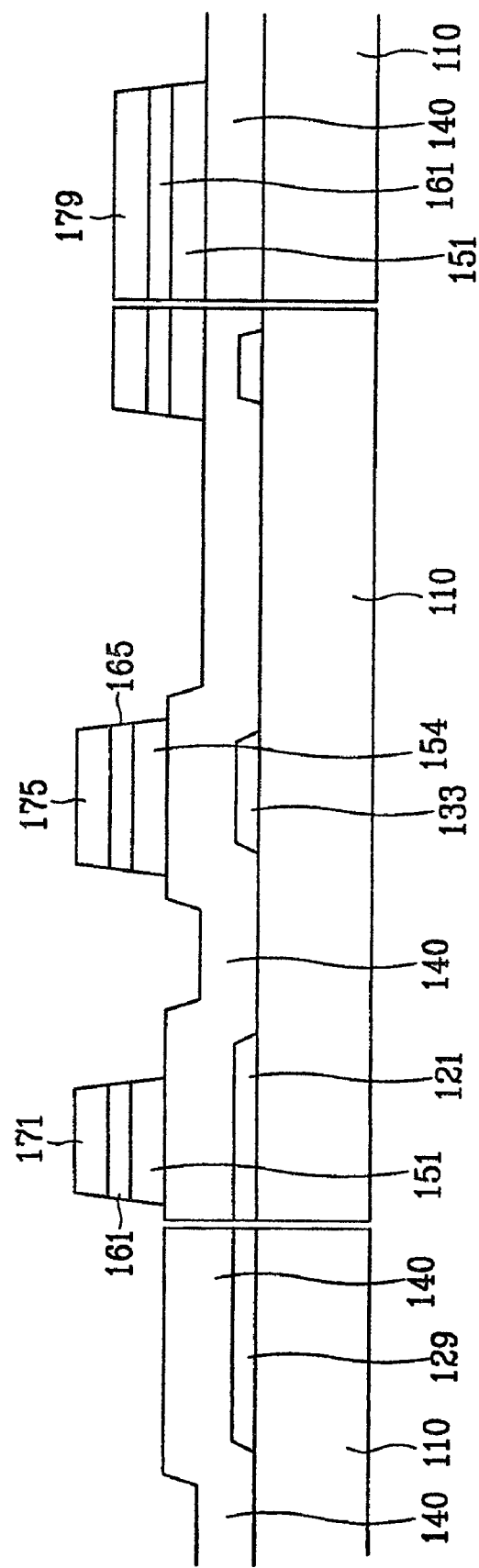
FIGS. 21A and 21B are sectional views of the TFT array panel shown in FIG. 20 taken along the lines XXIA-XXIA' and XXIB-XXIB', respectively.
Figure 21B:
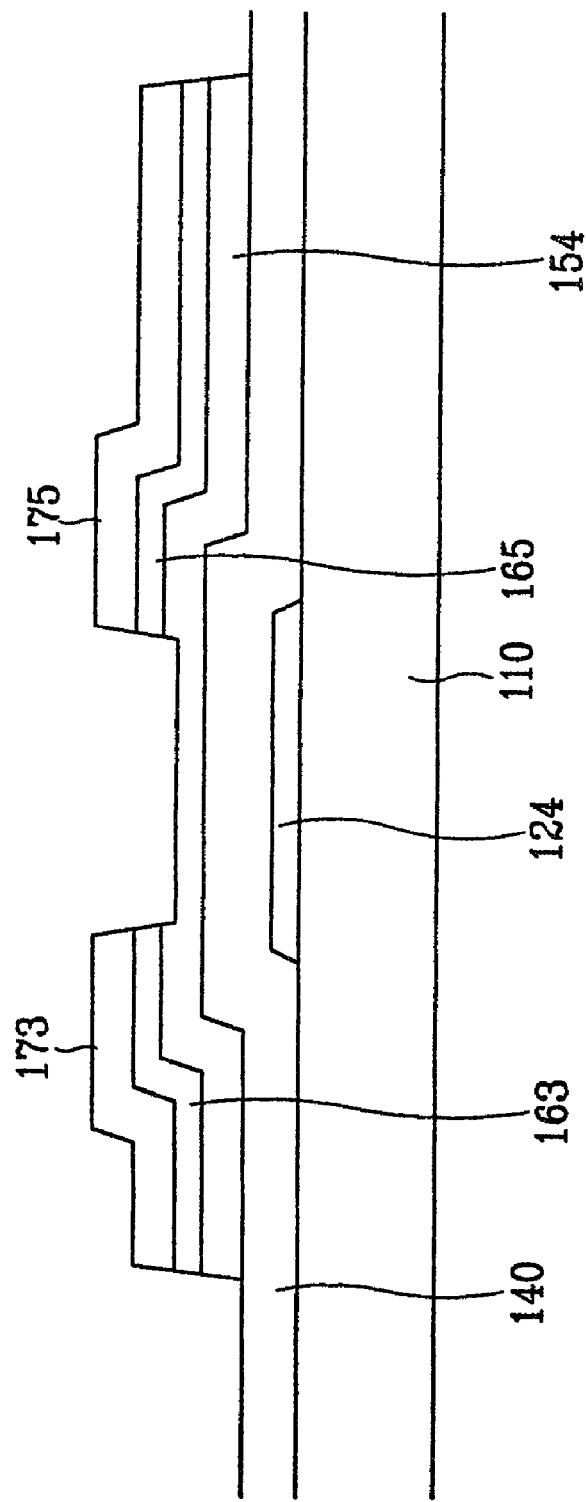
Figure 22:
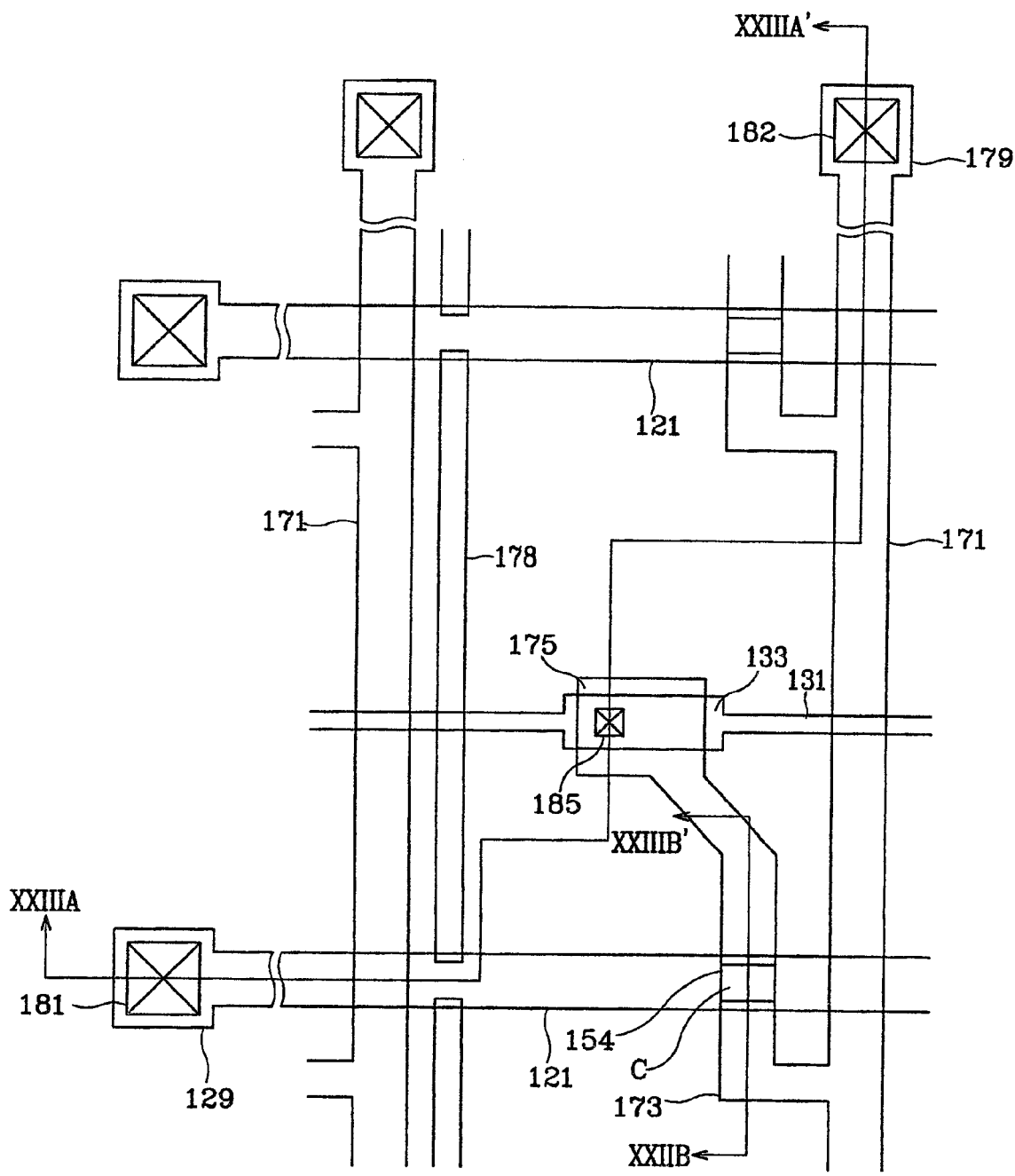
FIG. 22 is a layout view of a TFT array panel in the step following the step shown in FIGS. 21A and 21B.
Figure 23A:
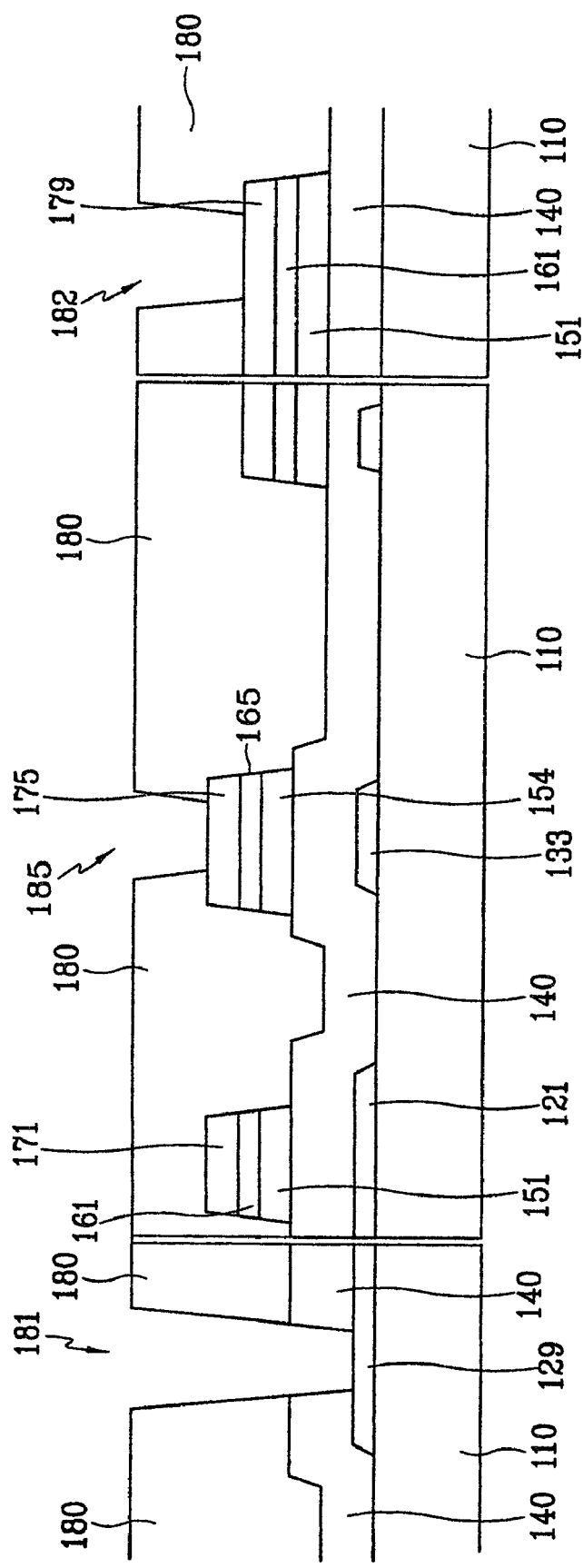
FIGS. 23A and 23B are sectional views of the TFT array panel shown in FIG. 22 taken along the lines XXIIIA-XXIIIA' and XXIIIB-XXIIIB', respectively.
Figure 23B:
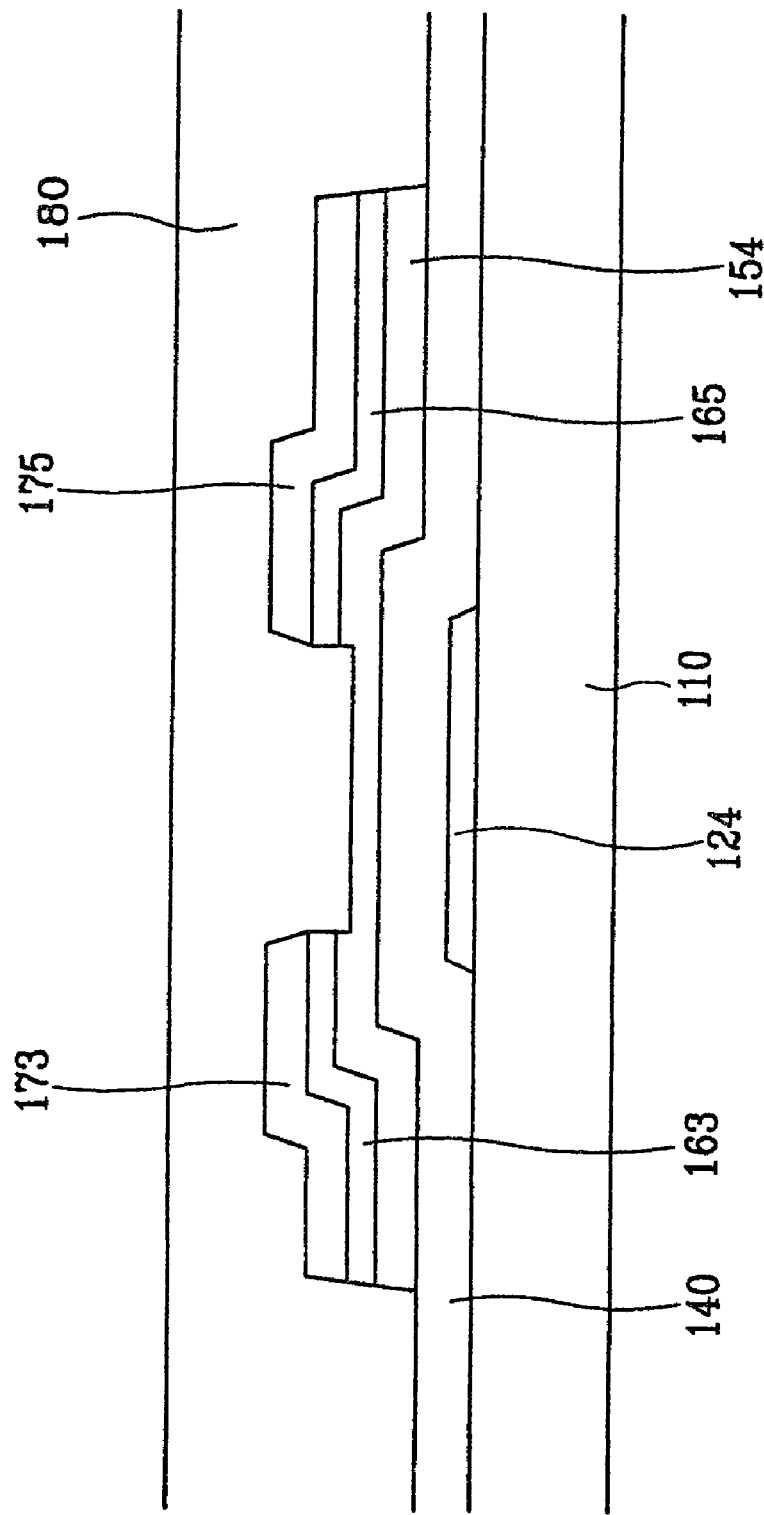

FIG. 16 is a layout view of a TFT array panel shown in FIGS. 1415B in the first step of a manufacturing method thereof according to an embodiment of the present invention; FIGS. 17A and 17B are sectional views of the TFT array panel shown in FIG. 17A taken along the lines XVIIA-XVIIA' and XVIIB-XVIIB', respectively; FIGS. 18A and 18B are sectional views of the TFT array panel shown in FIG. 16 taken along the lines XVIIA-XVIIA' and XVIIB-XVIIB', respectively, and illustrate the step following the step shown in FIGS. 17A and 17B; FIGS. 19A and 19B are sectional views of the TFT array panel shown in FIG. 16 taken along the lines XVIIA-XVIIA' and XVIIB-XVIIB', respectively, and illustrate the step following the step shown in FIGS. 18A and 18B; FIG. 20 is a layout view of the TFT array panel in the step following the step shown in FIGS. 19A and 19B; FIGS. 21A and 21B are sectional views of the TFT array panel shown in FIG. 20 taken along the lines XXIA-XXIA' and XXIB-XXIB', respectively; FIG. 22 is a layout view of a TFT array panel in the step following the step shown in FIGS. 21A and 21B; and FIGS. 23A and 23B are sectional views of the TFT array panel shown in FIG. 22 taken along the lines XXIIIA-XXIIIA' and XXIIIB-XXIIIB', respectively.

Referring to FIGS. 16-11B, a plurality of gate lines 121 including a plurality of gate electrodes 124 and a plurality of storage electrode lines 131 including a plurality of storage electrodes 133 are formed on a substrate 110 by depositing and photo-etching a conductive film.

Referring to FIGS. 18A and 18B, a gate insulating layer 140, an intrinsic a-Si layer 150, and an extrinsic a-Si layer 160 are sequentially deposited by CVD such that the layers 140, 150 and 160 bear thickness of about 1,500-5,000 Å, about 500-2,000 Å and about 300-600 Å, respectively. A conductive layer 170 is deposited by sputtering, and a photoresist film with the thickness of about 1-2 microns is coated on the conductive layer 170.

The photoresist film is exposed to light through an exposure mask (not shown), and developed such that the developed photoresist has a position dependent thickness. The photoresist shown in FIGS. 18A and 18b includes a plurality of first to third portions with decreased thickness. The first portions located on wire areas A and the second portions located on channel areas C are indicated by reference numerals 52 and 54, respectively, and no reference numeral is assigned to the third portions located on remaining areas B since they have substantially zero thickness to expose underlying portions of the conductive layer 170. The thickness ratio of the second portions 54 to the first portions 52 is adjusted depending upon the process conditions in the subsequent process steps. It is preferable that the thickness of the second portions 54 is equal to or less than half of the thickness of the first portions 52, and in particular, equal to or less than 4,000 Å.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist 52 and 54 enables to selectively etch the underlying layers when using suitable process conditions. Therefore, a plurality of data lines 171 including a plurality of source electrodes 173, and a plurality of drain electrodes 175, as well as a plurality of ohmic contact stripes 161 including a plurality of projections 163, a plurality of ohmic contact islands 165 and a plurality of semiconductor stripes 151 including a plurality of projections 154 are obtained as shown in FIGS. 20-21B by a series of etching steps.

For descriptive purpose, portions of the conductive layer 170, the extrinsic a-Si layer 160, and the intrinsic a-Si layer 150 on the wire areas A are called first portions, portions of the conductive layer 170, the extrinsic a-Si layer 160, and the intrinsic a-Si layer 150 on the channel areas C are called second portions, and portions of the conductive layer 170, the extrinsic a-Si layer 160, and the intrinsic a-Si layer 150 on the remaining areas B are called third portions.

An exemplary sequence of forming such a structure is as follows:

(1) Removal of third portions of the conductive layer 170, the extrinsic a-Si layer 160 and the intrinsic a-Si layer 150 on the wire areas A;

(2) Removal of the second portions 54 of the photoresist;

(3) Removal of the second portions of the conductive layer 170 and the extrinsic a-Si layer 160 on the channel areas C; and (4) Removal of the first portions 52 of the photoresist.

Another exemplary sequence is as follows:

(1) Removal of the third portions of the conductive layer 170;

(2) Removal of the second portions 54 of the photoresist;

(3) Removal of the third portions of the extrinsic a-Si layer 160 and the intrinsic a-Si layer 150;

(4) Removal of the second portions of the conductive layer 170;

(5) Removal of the first portions 52 of the photoresist; and (6) Removal of the second portions of the extrinsic a-Si layer 160.

The first example is described in detail.

Referring to FIGS. 19A and 19B, the exposed third portions of the conductive layer 170 on the remaining areas B are removed by wet etching or dry etching to expose the underlying third portions of the extrinsic a-Si layer 160. An Al containing metal film is preferably wet etched, while a Mo containing metal film can be etched both by dry etch and wet etch.

Reference numeral 174 indicates portions of the conductive layer 170 including the data lines 171 and the drain electrode 175 connected to each other. The dry etching may etch out the top portions of the photoresist 52 and 54.

Successively, the third portions of the extrinsic a-Si layer 160 on the areas B and of the intrinsic a-Si layer 150 are removed preferably by dry etching and the second portions 54 of the photoresist are removed to expose the second portions of the conductors 174. The removal of the second portions 54 of the photoresist are performed either simultaneously with or independent from the removal of the third portions of the extrinsic a-Si layer 160 and of the intrinsic a-Si layer 150. Residue of the second portions 54 of the photoresist remained on the channel areas C is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

Referring to FIGS. 20-21B, the second portions of the conductors 174 and the extrinsic a-Si stripes 164 on the channel areas C as well as the first portion 52 of the photoresist are removed.

In case that the exposed portions of the extrinsic semiconductor stripes 164 is removed using the data lines 171, the drain electrodes 175, and the storage capacitor conductors 177 as an etch mask after removing the photoresist film.

As shown in FIG. 21B, top portions of the projections 154 of the intrinsic semiconductor stripes 151 on the channel areas C may be removed to cause thickness reduction, and the first portions 52 of the photoresist are etched to a predetermined thickness.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

Next, a passivation layer 180 is deposited and photo-etched along with the gate insulating layer 140 to form a plurality of contact holes 181, 182 and 185.

Finally, as shown in FIGS. 14-15B, a plurality of pixel electrodes 190 and a plurality of contact assistants 81 and 82 are formed on the passivation layer 180 by sputtering and photo-etching an ITO or IZO layer. The etching of the IZO film may include wet etching using a Cr etchant such as $HNO_3/(NH4)_2Ce(NO_3)_6/H_2O$, which does not erode the exposed Al portions of the gate lines 121, the data lines 171, and the drain electrodes 175 through the contact holes 182, 183 and 185.

Since the manufacturing method of the TFT array panel according to an embodiment simultaneously forms the data lines 171, the drain electrodes 175, the semiconductors 151, and the ohmic contacts 161 and 165 using one photolithography process, the manufacturing process is simplified by omitting a photolithography step.

A TFT array panel for an LCD according to another embodiment of the present invention will be described in detail with reference to FIGS. 24 and 25.

Figure 24:
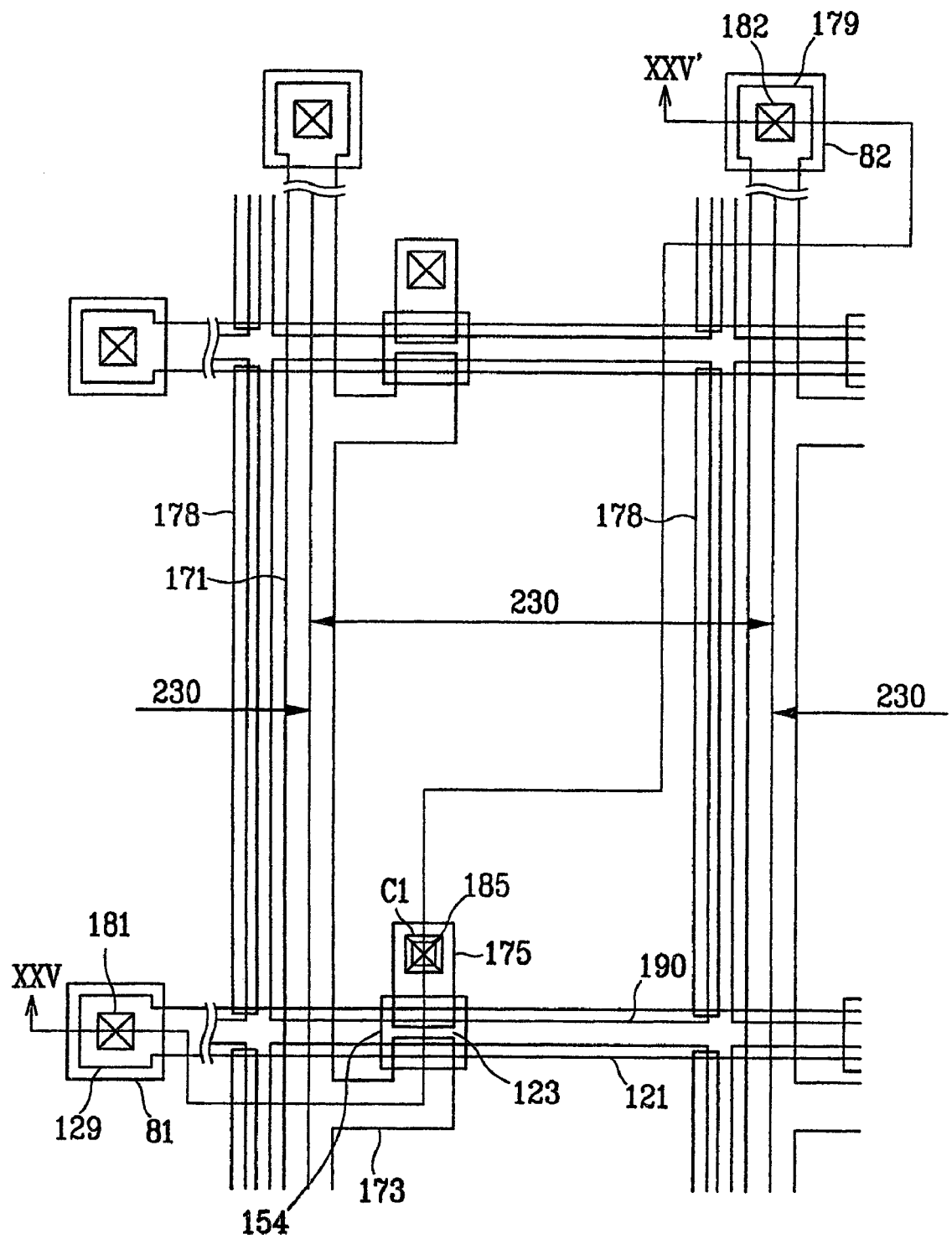
FIG. 24 is a layout view of a TFT array panel for an LCD according to another embodiment of the present invention.
Figure 25:
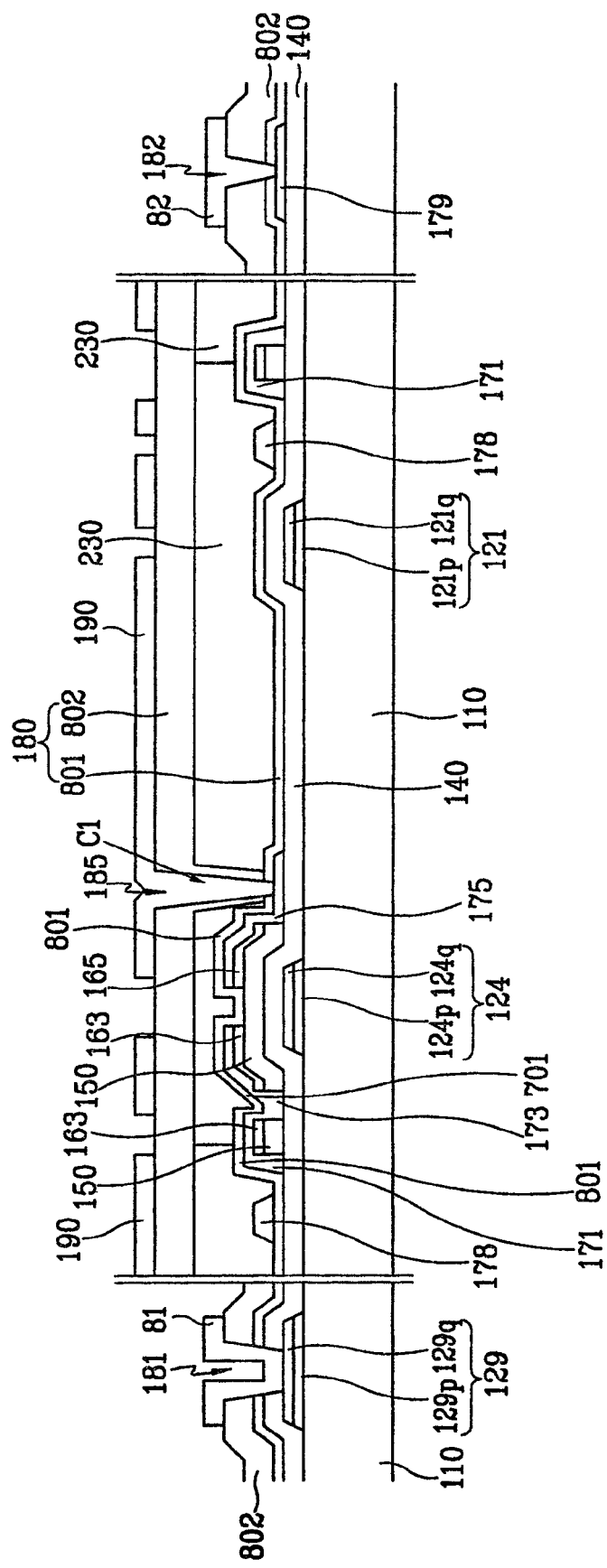
FIG. 25 is a sectional view of the TFT array panel shown in FIG. 24 taken along the line XXV-XXV'.

FIG. 24 is a layout view of a TFT array panel for an LCD according to another embodiment of the present invention, and FIG. 25 is a sectional view of the TFT array panel shown in FIG. 24 taken along the line XXV-XXV'.

Referring to FIGS. 24 and 25, a layered structure of the TFT array panel according to this embodiment is almost the same as those shown in FIGS. 1-3.

That is, a plurality of gate lines 121 including a plurality of gate electrodes 124 are formed on a substrate 110, and a gate insulating layer 140, a plurality of semiconductor islands 154, and a plurality of ohmic contacts 163 and 165 are sequentially formed thereon. A plurality of data lines 171 including a plurality of source electrodes 173, a plurality of light blocking conductors 178, and a plurality of drain electrodes 175 are formed on the ohmic contacts 161 and 165 and the gate insulating layer 140, and a passivation layer 180 are formed thereon. A plurality of contact holes 182 and 185 are provided at the passivation layer 180, and a plurality of pixel electrodes 190 and a plurality of contact assistants 82 are formed on the passivation layer 180.

Different from the TFT array panel shown in FIGS. 1-3, the passivation layer 180 of the TFT array panel according to this embodiment includes a lower insulating film 801 and an upper insulating film 802 and a plurality of red, green and blue color filters 230 are formed between the lower insulating film 801 and the upper insulating film 802.

The lower insulating film 801 is preferably made of inorganic insulator such as silicon nitride, and the upper insulating film 802 is preferably made of photosensitive organic material. Either of the lower and the upper insulating films 801 and 802 may be omitted.

The color filters 230 follow the shape of the pixel electrodes 190 and the color filters 230 in adjacent two data lines 171 and arranged in the longitudinal direction may be connected to each other to form a stripe. Edges of adjacent two of the color filters 230 exactly match with each other on the data lines 171, but the color filters 230 may overlap each other to block the light leakage between the pixel electrodes 190, or may be spaced apart from each other. The color filters 230 have a plurality of openings C1 exposing the contact holes 185 and the contact holes 185 are preferably smaller than the openings C1 as shown in FIG. 25 such that the openings C1 expose the contact holes 185 and a top surface of the lower insulating film 801.

In addition, the gate lines 121 and the data lines 171 have expanded end portions 129 and 179, respectively. Accordingly, a plurality of contact holes 181 exposing the end portions 129 of the gate lines 121 are provided at the gate insulating layer 140 and the passivation layer 180, and a plurality of contact assistants 81 connected to the end portions 129 through the contact holes 181 are additionally provided. The color filters 230 are not provided on a peripheral area which is provided with the expansions 129 and 179 of the gate lines 121 and the data lines 179.

Many of the above-described features of the TFT array panel for an LCD shown in FIGS. 1-3 may be appropriate to the TFT array panel shown in FIGS. 24 and 25.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
a gate line formed on a substrate;
a first insulating layer formed on the gate line;
a semiconductor layer formed on the first insulating layer;
a data line formed over the first insulating layer and intersecting the gate line;

a drain electrode formed at least on the semiconductor layer;

a conductor formed at the same layer as the data line, made of the same material as the data line, arranged in parallel to the data line and apart from the data line in a first direction;

a second insulating layer formed on the data line, the drain electrode, and the conductor and having a first contact hole exposing a portion of the drain electrode; and a pixel electrode formed on the second insulating layer and connected to the drain electrode through the first contact hole, wherein the pixel electrode covers a width of the data line.

2. The thin film array panel of claim 1, wherein the conductor is floating.

3. The thin film array panel of claim 1, wherein an edge of the pixel electrode is placed on the conductor.

4. The thin film array panel of claim 1, wherein the second insulating layer comprises organic material.

5. The thin film array panel of claim 1, wherein the second insulating layer comprises a color filter.

6. The thin film array panel of claim 5, wherein the second insulating layer further comprises a passivation film disposed on or under the color filter.

7. The thin film array panel of claim 1, further comprising a light blocking member disposed between the data line and the conductor.

8. The thin film array panel of claim 1, wherein the data line has an edge extending parallel to an edge of the pixel electrode.

9. The thin film array panel of claim 1, wherein the second insulating layer has a second contact hole exposing a portion of the data line and the thin film transistor array panel further comprises a first contact assistant connected to the data line through the second contact hole.

10. The thin film array panel of claim 9, wherein the second insulating layer has a third contact hole exposing a portion of the gate line and the thin film transistor array panel further comprises a second contact assistant connected to the gate line through the third contact hole.

11. The thin film array panel of claim 10, wherein the second or the third contact hole exposes an edge of the gate line or the data line.

12. The thin film array panel of claim 1, wherein the semiconductor layer has substantially the same planar shape as the data line and the drain electrode except for a portion disposed between the data line and the drain electrode.

13. The thin film array panel of claim 1, wherein a pixel area is defined by the data line and the gate line, and the pixel electrode overlaps with the conductor located in the pixel area corresponding to the pixel electrode.

14. The thin film array panel of claim 1, wherein a pixel area is defined by the data line and the gate line, and the pixel electrode does not overlap with the conductor located in the neighboring pixel area.

* * * * *